(12) United States Patent
Leedham et al.

(10) Patent No.: US 10,230,354 B2
(45) Date of Patent: Mar. 12, 2019

(54) VOLTAGE BALANCING IN SERIES-CONNECTED POWER SWITCHES

(71) Applicant: Maschinenfabrik Reinhausen GmbH, Regensburg (DE)

(72) Inventors: Robert John Leedham, Regensburg (DE); Mark Snook, Regensburg (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 54 days.

(21) Appl. No.: 15/315,559

(22) PCT Filed: Jul. 29, 2015

(86) PCT No.: PCT/EP2015/067325
§ 371 (c)(1),
(2) Date: Dec. 1, 2016

(87) PCT Pub. No.: WO2016/020227
PCT Pub. Date: Feb. 11, 2016

(65) Prior Publication Data
US 2018/0191332 A1 Jul. 5, 2018

(30) Foreign Application Priority Data
Aug. 8, 2014 (GB) .................................. 1414092.5

(51) Int. Cl.
*H03K 3/011* (2006.01)
*H03K 17/10* (2006.01)
(Continued)

(52) U.S. Cl.
CPC ......... *H03K 3/011* (2013.01); *H03K 17/0828* (2013.01); *H03K 17/107* (2013.01); *H03K 17/567* (2013.01); *H03K 17/168* (2013.01)

(58) Field of Classification Search
CPC .............. H03K 3/011; H03K 17/0828; H03K 17/0826; H03K 17/107; H03K 17/12; H03K 17/122; H03K 17/125; H03K 17/127
(Continued)

(56) References Cited

U.S. PATENT DOCUMENTS 5,946,178 A * 8/1999 Bijlenga ............... H02M 7/538
361/91.5
7,274,243 B2 9/2007 Pace
(Continued)

FOREIGN PATENT DOCUMENTS

WO 1997043832 A 11/1997

*Primary Examiner* — Patrick C Chen
(74) *Attorney, Agent, or Firm* — Andrew Wilford

(57) ABSTRACT

A method for voltage balancing series-connected power switching devices (IGBTs) each connected in parallel with a respective diverter having controllable impedance to controllably conduct current diverted from the associated power switching device, the method comprising the step of controlling each diverter to follow a series of at least two successively higher impedance states during an OFF period of the power switching devices. The series of impedance states for each diverter comprises a first impedance and then a second, higher impedance, the first impedance occurring in response to an indication of a start of the OFF period. The first impedance state preferably occurs during a tail current of the power switching device in parallel with the respective diverter and the second or later impedance state during a leakage current of that power switching device.

7 Claims, 27 Drawing Sheets

(51) Int. Cl.
    *H03K 17/16* (2006.01)
    *H03K 17/082* (2006.01)
    *H03K 17/567* (2006.01)
(58) Field of Classification Search
    USPC .......................................................... 327/109
    See application file for complete search history.

(56) References Cited

U.S. PATENT DOCUMENTS

| 8,536,836 | B2 | 9/2013 | Delaille |
| 2012/0230076 | A1 | 9/2012 | Palmer |
| 2013/0133358 | A1* | 5/2013 | Ito .......................... H02M 5/297 62/426 |

* cited by examiner

Off->On 1
10us

FETs mimic resistors
Rfet=100ohms

FETs mimic resistors
Every 10th circuit different

Off->On 2
10us

Rfet=100ohms
IGBT has Vfb loop around
Vfb target d=50v below prev

Every 10th IGBT is different;
Rfet=50ohms, IGBT OFF

Off->On 3
10us

Rfet increases in steps to 1000ohms
IGBT has Vfb loop around, takes known current Off->On 4
Rfet=1000ohms Lock off each IGBT gate voltage
Rfet = 1000ohms Off->On 4
Rfet=1000ohms Lock off each IGBT gate voltage
Rfet = 1000ohms Rfet=50ohms, IGBT ON Off->On 5
Rfet=100ohms Synchronour turn ON of IGBT's
IGBTs have Vfb loop around
Ref decreases, causig IGBTs o turn ON Rfet=50ohms, IGBT ON All IGBT's in vfb, target approx 50v
FET mimics transzorb All IGBT's switched OFF synchronously
FET mimics transzorb

Steady State OFF
- practical implementation

Steady State OFF
- ideal curves

Diverter Zref sets which curve is followed

VOLTAGE BALANCING IN SERIES-CONNECTED POWER SWITCHES

CROSS REFERENCE TO RELATED APPLICATIONS

This application is the US-national stage of PCT application PCT/EP2015/067325 filed 29 Jul. 2015 and claiming the priority of British patent application 1414092.5 itself filed 8 Aug. 2014.

FIELD OF THE INVENTION

This invention generally relates to a method for voltage balancing series connected power switching devices, a circuit for voltage balancing series connected power switching devices, a method for dynamic voltage balancing of series connected power switching devices, and a circuit for dynamic voltage balancing of series connected power switching devices during turn-on.

BACKGROUND TO THE INVENTION

When power switching modules, e.g., IGBT modules/devices, are connected in series and switched, the voltage measured from collector to emitter of each device should not exceed the maximum rating at any time. Considering a static off case however, due to parameter imbalance between modules, the voltage across a device may not remain constant when the series devices are off since the output capacitances of the modules may charge and discharge. It is therefore desirable to take measures to ensure the voltage across each device stays within the module rating when the device is off.

So-called "static voltage sharing" generally maintains a balance of voltages across each individual IGBT module that is connected in series such that no one device exceeds its voltage rating when the devices are off.

Similarly, it is desirable to provide "dynamic voltage sharing" during a switching edge. If a chain of devices doesn't switch synchronously for example because one device switches early or late then a device may be destroyed. For example, as devices turn on it is possible that one device is left behind and it will very quickly be subjected to the full blocking voltage. Dynamic voltage sharing generally maintains a balance of voltages across each individual IGBT module that is connected in series so that no one device exceeds it voltage rating during switching.

One technique for voltage sharing involves using a series of voltage balancing resistors in parallel with the power switching device. Some capacitance devices may also be used in parallel to dominate IGBT module capacitance. Such additional circuitry however can be large and waste power.

Other techniques are generally feedback control schemes. For example, Active Voltage Control (AVC) wherein each power switching device has its own feedback loop, such loops generally being driven with the same reference signal profile. Such circuits may prevent series IGBTs operating beyond their safe operating limits by limiting IGBT collector voltage. FIGS. 14a and 14b respectively represent example an Active Voltage Control (AVC) circuit and a Cascade Active Voltage Control (CAVC) circuit, each showing a reference signal being input to a difference amplifier Vref terminal. Such AVC or CAVC circuitry may be applied to each power switching device in a series connection of such devices. Examples of AVC are found in WO 97/43832 and WO 2008/032113 (both Patrick Palmer et al). (C)AVC can further be used for voltage clamping of a power switching device.

Further regarding AVC, and having considered background art such as discussed above, the present inventors now consider that practical realization of feedback control schemes is difficult due to the parasitic (stray) inductance and resistance in large power switch modules. The inventors have further considered in this regard that to synchronize multiple IGBTs with AVC, a voltage plateau at turn-off may be introduced. This may hold the multiple IGBTs in the linear region for a short time in order to synchronize the switching edge. Further still, the inventors now disclose that at turn-on a current measurement and feedback scheme would be preferable as the current builds up before the voltage changes, so to synchronize devices it may be preferable to hold multiple IGBTs in a low current state. However, current based control may be expensive, inaccurate, lossy and/or the current may be slow to measure. In particular, measuring very high currents (e.g., 1000 s of Amps) without power loss and/or with wide dynamic range is difficult. Furthermore feedback loop delay, which reduces the loop bandwidth, means it may only be possible to control slowly switching devices. Slower switching generally allows more control but also results in higher power consumption, even when the circuit is designed to switch at zero volts.

For certain applications (e.g., High Voltage Direct Current (HVDC) converters and medium voltage motor drives) a solution for series connected IGBT modules is particularly desirable. For example, in a HVDC voltage sourced converter (VSC), series connected IGBT modules can be used as AC switches where the switching frequency is low (100 to 120 times a second). Losses in the system are predominantly conduction losses of the IGBTs, so switching slowly may not be a problem Under certain fault conditions however, the IGBTs are required to switch at a higher rate (say 2 kHz) for a short time, so a system design needs to take account of the higher switching loss under a fault condition The higher frequency switching requirement generally means that other power semiconductors such as thyristors or GTOs cannot be used. Therefore, improved control of power switching devices such as IGBTs is desired.

In view of the above, there remains a need to provide voltage balancing and/or clamping of series connected power switching devices such as IGBTs, with e.g. low power dissipation, accuracy of voltage sharing, and/or fast balancing etc. Additionally or alternatively, improved voltage balancing in static off states and/or dynamic on/off switching transitions of the series connected devices is desirable, preferably with low component count and/or low cost etc, for such voltage balancing and/or voltage clamping.

For use in understanding the present invention, the following disclosures are referred to:
- EP 0 898 811 B1 (Cambridge University Technical Services Ltd., Palmer et al), from EP 97 921 962.3 published Mar. 3, 1999 of same family as WO 97/43832, published Nov. 20, 1997, applicants and inventors Patrick Palmer et al.;
- US 2010/0060326 A1 (Cambridge Enterprise Ltd., Palmer et al), published Nov. 3, 2010 of same family as WO 2008/032113, published Mar. 20, 2008, applicants and inventors Patrick Palmer et al.;
- GB 2 488 778 B (Amantys Ltd., Palmer et al), corresponding to GB 1 103 806.4 published Dec. 9, 2012;
- US 2005/0253165 A1 (Pace and Robbins), published Nov. 17, 2005.

SUMMARY

According to a first aspect of the present invention, there is provided a method for voltage balancing series connected power switching devices, wherein at least one said power switching device is connected in parallel with a respective diverter, each said diverter having controllable impedance to controllably conduct current diverted from a respective said power switching device, the method comprising: controlling each said diverter to follow a series of successively higher impedance states during an off period of the power switching devices, the series comprising at least two said impedance states, wherein each said series comprises at least a first impedance of a diverter and then a second, higher impedance of the diverter, the first impedance occurring responsive to an indication of a start of the off period.

Advantageously, an embodiment may allow current imbalances at the start of the off period to be borne by diverters rather than by power switching devices, the power switching devices preferably taking more of the current as imbalanced currents (e.g., tail and/or leakage) subside. This may result in low voltage imbalance between the power switching devices and so improve static voltage balancing.

In this regard, the diverter(s) may pass current that would otherwise pass through the corresponding power switching device(s). The bypass current will depend on the impedance (resistance and/or reactive impedance) of the diverter, which preferably has a first of the impedance states immediately after the power switching devices have turned off. The diverter impedance may be decreased at or prior to the start of the off period in order to have the first impedance state. The start of the off period may be indicated for example by detecting when a diverter or power switching device current reaches substantially zero (taking into account tail current for example) or a predetermined current level, or by detecting when voltage across a diverter or power switching device reaches a predetermined level, and/or when a turn-off signal to at least one diverter is activated (optionally applying a predetermined delay to then provide the indication of start of the off period). The impedance increasing may involve 2, 3 or more, preferably predefined, discrete impedance states or impedance states that form part of a gradual, smooth increase of impedance.

Furthermore, the series may be predefined in terms of a diverter control input levels (Zref) and/or timing of changing from each state to the next. At least one such level applied to result in a said impedance of a diverter may be determined on the basis of measurement of voltage across the diverter and/or current through the diverter (e.g., using a sense resistor in series with the diverter).

There may further be provided the method, wherein the first impedance occurs during a tail current of a said power switching device in parallel with the diverter and a later said impedance state of the series occurs during a leakage current of the power switching device. Generally, when each power switching device turns off, it will have a tail current due to recombination of minority carriers in the device. Such a tail current (e.g., tail current subsiding from 50 A over ~20 s) may be substantially proportional to the amount of current being carried in the device before turn-off, and may be more clearly seen if the device has been on for at least, e.g., 20 s. Once the tail current has subsided, the leakage current (generally of the order of microamps) from the device may continue to flow. The leakage current is generally a DC current and may be a function of temperature and/or differences in device characteristics.

In this regard, it is noted that tail current and leakage current under given switching conditions may vary from device to device due to manufacturing variations. Even if series connected switching devices switch synchronously at turn-off, differences in tail current and imbalance in leakage currents will generally mean that the voltages across the devices will diverge. The additional or alternative use of diverters preferably across all power switching devices may represent a simpler technique for improving or implementing voltage sharing.

In view of the above, the later impedance state may occur responsive to detecting an end of the tail current and/or responsive to detecting leakage current. Similarly, the first resistance may occur responsive to detecting the start of a tail current. Either such current may be detected for example by measuring a current or voltage of a sense resistor in series with at least one diverter, e.g., detecting when the measurement or a rate of change thereof reaches a threshold level.

There may further be provided the method, comprising: monitoring a signal of each diverter to thereby detect imbalance between the monitored signals, wherein each said signal indicates at least one of current through and voltage across the diverter, wherein at least one of said successively higher impedance states of at least one said diverter occurs is responsive to detecting a reduction of a said imbalance. The monitoring and controlling of the signals from respective diverters may be performed centrally, e.g. at a central valve controller receiving feedback from the diverters. Thus, a controller may detect differences between the signals indicative of such imbalance.

There may further be provided the method, wherein at least one of said successively higher impedance states of a diverter occurs when a maximum detected difference between monitored said signals of the diverter and at least one (preferably all) other said diverter is less than a predefined amount. The amount may be a predetermined threshold value, or a predetermined fraction or percentage of a minimum, average or maximum one of the monitored signals. Thus all diverters may be changed to a next impedance state when the maximum difference, representing the extent of imbalance, reaches the amount. This may apply for one or more, e.g., the last, transitions from one state to the next of the series.

There may further be provided the method, wherein at least one (e.g., a second or later) of said successively higher impedance states of at least one said diverter (preferably all) occurs at a predefined time delay from the indication of the start of the off period. Thus, the timing of transitions between states may be determined in advance rather than in response to signal monitoring.

There may further be provided the method, comprising turning at least one (preferably all) of the diverters off at a predefined time from the indication of the start of the off period.

Thus, the diverters may be controlled to have their highest resistance state of the series at a predetermined time. The time duration of voltage balancing at the start of the off period may thus be limited, so that normal open- or closed-loop (e.g., using AVC) control may take over.

There may further be provided the method, comprising controlling the diverter impedances synchronously. Thus, that transitions between states to increase the impedances of diverters on a string of power switching devices may occur substantially (e.g., exactly) simultaneously, preferably under control of a central controller.

There may further be provided the method, wherein the power switching devices comprise IGBTs. For example, vertical IGBTs which are generally preferable for high power, high voltage applications may be used. Generally, the power switching device may be any non-latching power switch.

According to a second aspect of the present invention there is provided a circuit for voltage balancing series connected power switching devices, the circuit comprising: at least one diverter configured to be connected in parallel with a respective said power switching device; a control circuit configured to receive an indication of a start of an off period of the power switching devices; the control circuit further configured to control impedance of each said diverter to follow a series of successively higher impedance states during the off period, the series comprising at least two said impedance states, wherein each said series comprises at least a first impedance of the diverter and then a second, higher impedance of the diverter.

Similarly as for the first aspect, this may result in low voltage imbalance between the power switching devices and so improve static voltage balancing.

There may further be provided the circuit, wherein the indication comprises a turn-off signal to trigger turn-off of the power switching devices. Thus the indication may be a signal to initiate turn-off all of the power switching devices (e.g., IGBTs), and may be received from a central valve controller. Alternatively the signal may be for initiating turn-off of a respective power switching device.

There may further be provided the circuit, wherein the control circuit is configured to receive from each diverter a signal indicating at least one of current through and voltage across the diverter and to control each diverter on the basis of the signal such that the first impedance occurs during a tail current of a said power switching device in parallel with the diverter and a later said impedance state of the series occurs during a leakage current of the power switching device.

There may further be provided the circuit, wherein the control circuit is configured detect an end of a tail current through the power switching device and to control the diverter to have the later impedance responsive to said detecting.

There may further be provided the circuit, comprising: the control circuit having an input to receive from each said diverter a signal indicating at least one of current through and voltage across the diverter, the control circuit configured to monitor imbalance between the received signals and to trigger at least one of said successively higher impedance states of the diverter responsive to detecting a reduction of said imbalance.

There may further be provided the circuit, wherein the diverter comprises an IGBT or MOSFET having the controllable impedance, the diverter preferably a Si or SiC device.

According to a third aspect of the present invention, there is provided a method for dynamic voltage balancing of series connected power switching devices, each said power switching device coupled in parallel with a respective diverter having controllable impedance to controllably conduct current diverted from the power switching device, the method comprising: (a) controlling each said diverter to have a first impedance, wherein the power switching devices are off; then (b) controlling each said diverter to have a second, higher impedance to cause current to be commutated from the diverter to the power switching device coupled in parallel with the diverter; and (c) turning each said power switching device fully on.

In an embodiment, a power switching device may thus be turned on in a controlled fashion, by allowing a respective diverter to conduct an initial "known" current determined by its first impedance, that current in effect being then passed to the power switching device when the diverter changes to its second impedance. (The passing of that current may allow the power switching device to enter its active region without however being fully on, e.g., saturated). Thus, timing of current increases and levels of current increase through power switching devices during dynamic turn on may be controlled. Voltage imbalances arising from differences between power switching modules, e.g., output capacitances, may thus be reduced. In this regard it is noted that more than two current commutations from each diverter to a corresponding power switching device may occur if each diverter has a series of increasing impedance states comprising the first and second impedances and an additional one of more increased impedances before the step of turning the devices fully on.

There may further be provided the method, wherein each diverter when having the first impedance is controlled to have a predefined current for commutation in step (b) to the power switching device connected in parallel with the diverter.

There may further be provided the method, comprising using feedback loops to control respective said power switching devices, each said feedback loop comprising a difference amplifier receiving from the diverter coupled in parallel with the power switching device a feedback signal indicating at least one of current through and voltage across the diverter, wherein the difference amplifier controls the respective power switching device based on a difference between a reference signal and a said feedback signal, wherein the step (b) comprises for each said feedback loop: setting the reference signal to the difference amplifier to differ from the feedback signal; the difference amplifier beginning to turn the power switching device on responsive to the difference between the reference signal and the feedback signal; detecting a degree of stabilisation of the feedback loop; and then increasing impedance of the diverter (preferably in more than one step and/or smoothly) responsive to said change detection, and wherein the step (c) comprises adjusting the reference signal to cause the feedback loop to fully turn on the power switching device.

Such a difference amplifier may comprise any type of comparator and is preferably analog, e.g., implemented with an operational amplifier.

There may further be provided the method, wherein the detecting a degree of stabilisation of the feedback loop comprises detecting a predefined change of the feedback signal. For example, the predefined change may be a predefined portion of the difference, e.g., 25%, 50%, 75% of the difference between the reference signal and the feedback signal.

There may further be provided the method, wherein the controlling each said diverter to have a second, higher impedance comprises controlling the diverter to have a series of successively higher impedances to reach the second, higher impedance. Such impedances may be discrete impedance levels or may be part of a smooth or gradual increase of impedance.

There may further be provided the method, comprising controlling the diverter impedances synchronously. Such control may be such that increases in the impedances (e.g., resistances) occur exactly simultaneously, preferably under control of a central controller coupled to all of the diverter control terminals (e.g., gates).

There may further be provided the method, wherein at least one of the series connected power switching devices is not controlled by a said feedback loop, the method comprising: during at least the steps (a) and (b), each diverter coupled in parallel with a power switching device not controlled by a said feedback loop having a impedance lower than the first impedance; then before step (c), turning fully on the power switching devices not controlled by said feedback loops.

According to a fourth aspect of the present invention, there is provided a circuit for dynamic voltage balancing of series connected power switching devices during turn-on, the circuit comprising: at least one diverter configured to be connected in parallel with a respective said power switching device; and a control circuit having: an input to receive a turn-on signal for triggering turn-off of the power switching devices; and at least one output to in response to the turn-on signal control a said diverter to have a first impedance and to subsequently control the diverter to have a second, higher impedance to cause current to be diverted from the diverter to the power switching device coupled in parallel with the diverter, the control circuit configured to subsequently turning each said power switching device fully on.

There may further be provided the circuit, comprising: feedback loops to control respective said power switching devices, each said feedback loop comprising a difference amplifier having an input to receive from the diverter coupled in parallel with the power switching device a feedback signal indicating at least one of current through and voltage across the diverter, wherein the difference amplifier is configured to control the respective power switching device based on comparing a reference signal to a said feedback signal.

There may further be provided the circuit, wherein at least one of the series connected power switching devices lacks a said feedback loop and the control circuit is configured to control the diverter coupled in parallel with the at least one of the series connected power switching devices to have a impedance lower than the first impedance.

There may further be provided the circuit, wherein the diverter comprises a Si IGBT or SiC MOSFET having the controllable impedance.

According to a further aspect, there is provided a plurality of diverters each having a first conduction terminal coupled to a conduction terminal of a respective said power switching device; and for each said diverter: a first configuration switch controllable to couple a second conduction terminal of the diverter to an other conduction terminal of the power switching device, to configure the diverter to be coupled in parallel with said power switching device; and a second configuration switch controllable to couple said second conduction terminal of the diverter to a control terminal of the power switching device, to allow the diverter to clamp a voltage on the control terminal while the first configuration switch is off. Thus a configurable circuit using the or each diverter to provide voltage balancing and/or clamping may be provided. The first and second configuration switches may be referred to as M2 and M1, respectively, and are preferably controlled such that both switches are not on at the same time. The first conduction terminal may be coupled to a collector conduction terminal of the power switching device. The first configuration switch may be controlled to couple the second conduction terminal of the diverter to the other conduction terminal (e.g., emitter) of the power switching device when the second configuration switch is off. The clamping action, e.g., during dynamic turn-on or turn-off, may be achieved by conduction through the diverter in series with a diode. The impedance of the diverter may be controlled, e.g., on the basis of voltage across a sense resistor, to control current provided to a gate of a power switching device through the diode.

There may further be provided the circuit, comprising a control circuit configured to receive an indication of a start of an off period of the power switching devices; the control circuit further configured to, while the first configuration switch is on and the second configuration switch is off, control impedance of at least one said diverter to follow a series of successively higher impedance states during the off period, the series comprising at least two said impedance states, wherein each said series comprises at least a first impedance of the diverter and then a second, higher impedance of the diverter.

There may further by provided the circuit, for dynamic voltage balancing of series connected power switching devices during turn-on, the circuit comprising a control circuit having: an input to receive a turn-on signal for triggering turn-off of the power switching devices; and at least one output to, while the first configuration switch is on and the second configuration switch is off, in response to the turn-on signal control at least one said diverter to have a first impedance and to subsequently control the diverter to have a second, higher impedance to cause current to be diverted from the diverter to the power switching device coupled in parallel with the diverter, the control circuit configured to subsequently turn each said power switching device fully on.

Preferred embodiments are defined in the appended dependent claims.

Any one or more of the above aspects and/or any one or more of the above optional features of the preferred embodiments may be combined, in any permutation.

BRIEF DESCRIPTION OF THE DRAWINGS

For a better understanding of the invention and to show how the same may be carried into effect, reference will now be made, by way of example, to the accompanying drawings, in which:

FIGS. 2a to 7a similarly represent stages of turn on in an embodiment, wherein the diagrams illustrate two series-connected power switching devices and corresponding diverters (each diverter represented as a resistance, each power switching device represented as an IGBT with optional feedback control circuit) further in series with the/each nth power switching device (represented as an IGBT that is either off or ON) and corresponding diverter (represented as a resistor);

FIG. 8 shows schematic representations of example voltages and currents on the power switching devices and diverters in the process of FIGS. 2 to 7 and/or 2a to 7a;

DETAILED DESCRIPTION OF PREFERRED EMBODIMENTS

Figure 12:
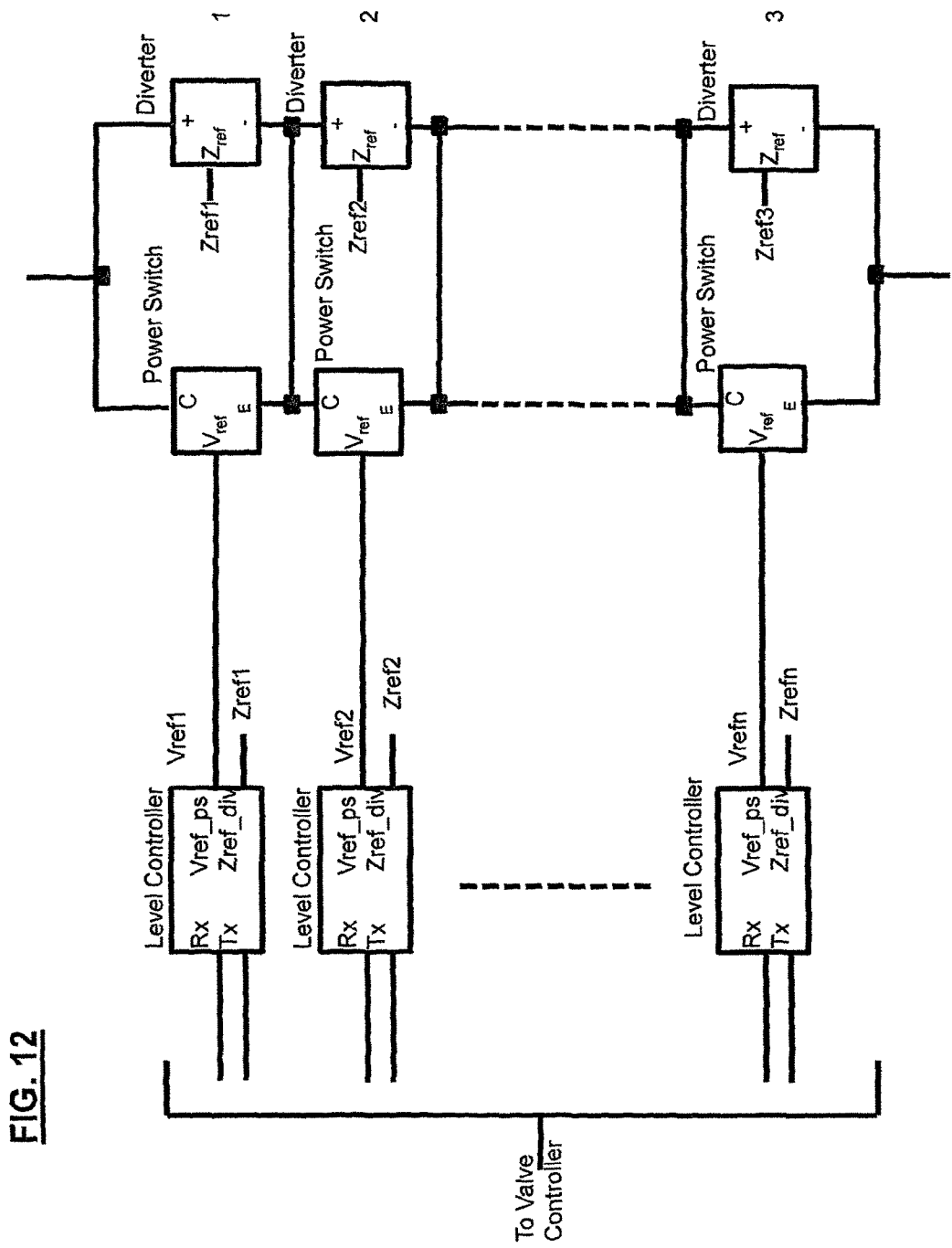
FIG. 12 shows an embodiment of a valve comprising power switches and diverters, together with optional interface circuitry in the form of level controllers.

FIG. 12 shows a top-level structure of a system embodiment comprising power switching device subsystem (power switches), e.g., IGBTs or MOSFETs, each with a control circuit and input reference voltage Vref and collector and emitter terminals (C, E) coupled to a paralleled diverter. Each control signal Zref from a central valve controller (optionally via a level controller) controls the impedance of a corresponding diverter.

Figure 15:
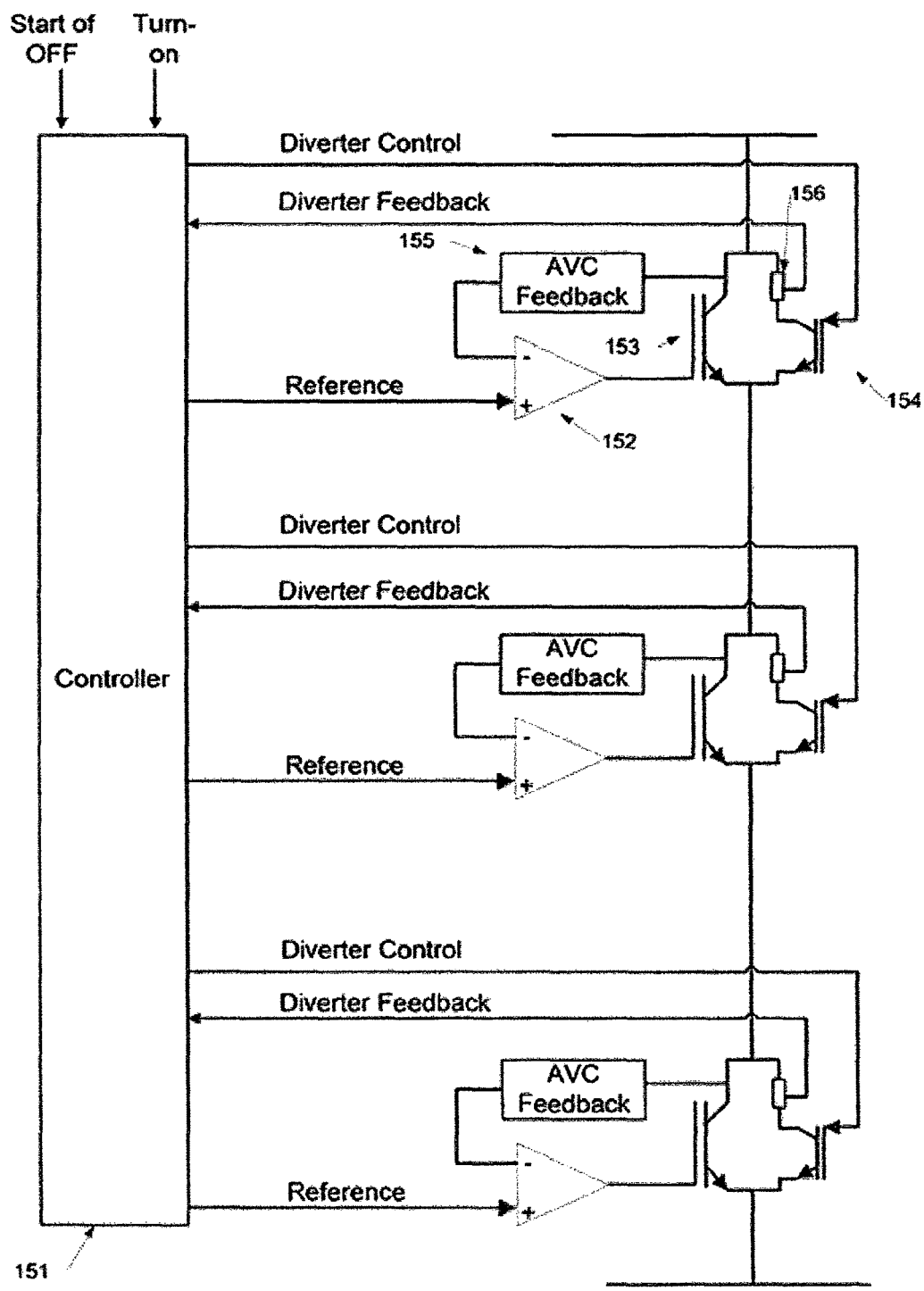
FIG. 15 shows an embodiment comprising a chain of power switching devices.

An alternative representation of an embodiment is provided in FIG. 15 having a central controller (control circuit) 151 and, merely for example, a chain of power switching devices 153. The control circuit receives an indication of a start of the off period of at least one (preferably all) of the power switching device and/or a turn-on signal for triggering turn-off of at least one (preferably all) of the power switching devices. A feedback loop for voltage balancing is provided using optional AVC feedback circuitry (e.g., a potential divider) 155 and a difference amplifier 152 receiving a reference signal (e.g., Zref). A diverter 154 is coupled in parallel with each power switching device 153 and in series with a sense resistor 156. A diverter feedback signal indicating current through, or voltage across, the sense resistor. Alternatively, the feedback signal may for example indicate the collector voltage or collector-emitter voltage of the diverter or IGBT.

A valve generally comprises a collection of power switching modules that form an overall switch, each module comprising at least a power switching device such as an IGBT. Further referred to is a valve controller, which generally comprises a device that coordinates switching of multiple such modules. (It is noted that "device" and "module" are used interchangeably through this specification in relation to the power switching devices; a module may comprise a power switching device and any optionally other component(s) such as a free-wheeling diode).

Further referred to is a diverter, sometimes alternatively referred to/represented as e.g. a resistor or an active voltage clamp. A diverter preferably comprises a controllable, linear device such a MOSFET (preferably a high frequency such device) and may in an embodiment be described as a programmable bypass element. In standard gate drives a transorb device (transient voltage suppressor) is often connected between the collector and gate of a device to provide a voltage clamp, and so the symbol for a transorb has been used in some of the drawings to at least partially represent a diverter.

Generally, embodiments may provide methods for balancing series connected power devices to ensure static voltage sharing and/or voltage clamping during switching. The voltage across each of series connected IGBTs may be managed at least during the on-off transition, the off-ON transition and/or during static off while the modules are off.

This may be achieved using active circuits that each work in parallel with a respective power switching module and which perform various functions during the switching cycle. Each active circuit has a diverter to which a feedback control scheme may be applied. The diverter may comprise a high voltage transistor (preferably with similar rating to the power switching module) which can preferably more easily be controlled than the power switching module. The diverter may comprise, relative to the power switching module, a smaller device and/or is preferably a high voltage fast device. Example devices are Si IGBT or SiC FET e.g. SiC MOSFET. The diverter may be used to mimic a resistor (or resistive and/or reactive impedance), or a transorb, or both in parallel. As described in more detail below, a diverter may be used as a current diverter and/or active clamp in parallel with a power switching module. A communication system may be used to send measured parameters, such as diverter voltage and/or current, to a valve controller. The valve controller may respond with a target clamp voltage and/or resistance values for various parts of the switching process.

The controlled diverter may effectively be an active switch with a control system and work in parallel with the main power switching device (IGBT). Such diverters may ensure the voltage across series connected devices is equally shared. After turn-off, e.g., at the start of static off, a diverter may be controlled (e.g., by a Zref as shown in FIG. 12) to balance tail current and then back off to balance leakage current.

Additionally or alternatively, a diverter may be controlled to pass a "known" (preset or determined by preset control parameters, or set to a predetermined value by measuring a current in the diverter for example using a sense resistor and adjusting diverter impedance accordingly) current, which is then transferred to the corresponding power switching device in order to move the power switching device into an active (linear) region of operation. From here the power switching device can be more easily controlled with known timing. Additionally or alternatively, at turn-on a diverter may bleed a small proportion (e.g., 10%) of the load current which is then shifted to a corresponding power switching device to get that device active.

Diverter(s) control may therefore at least partly determine the turn-on and/or turn-off switching times of corresponding power switching module(s). This may help to ensure switching is synchronized more accurately.

Considering for example an IGBT, it is noted that "tail current" is generally defined as that part of the collector current (Ic) waveform of an IGBT where Ic continues to flow after an initial abrupt fall. The IGBT generally exhibits the tail current during the turn-off process. Excess carriers are generally stored in the drift region during the turn-off process. It can take a relatively long time to remove the excess carriers due to a slow recombination process. Therefore the "tail time" of the IGBT can be long. A leakage current may flow from the collector to the emitter when the IGBT is off at a specific collector-emitter and gate-emitter voltage. The leakage current generally flows through a reversed biased collector emitter junction and generally increases with temperature.

Static Off State

Figure 1:
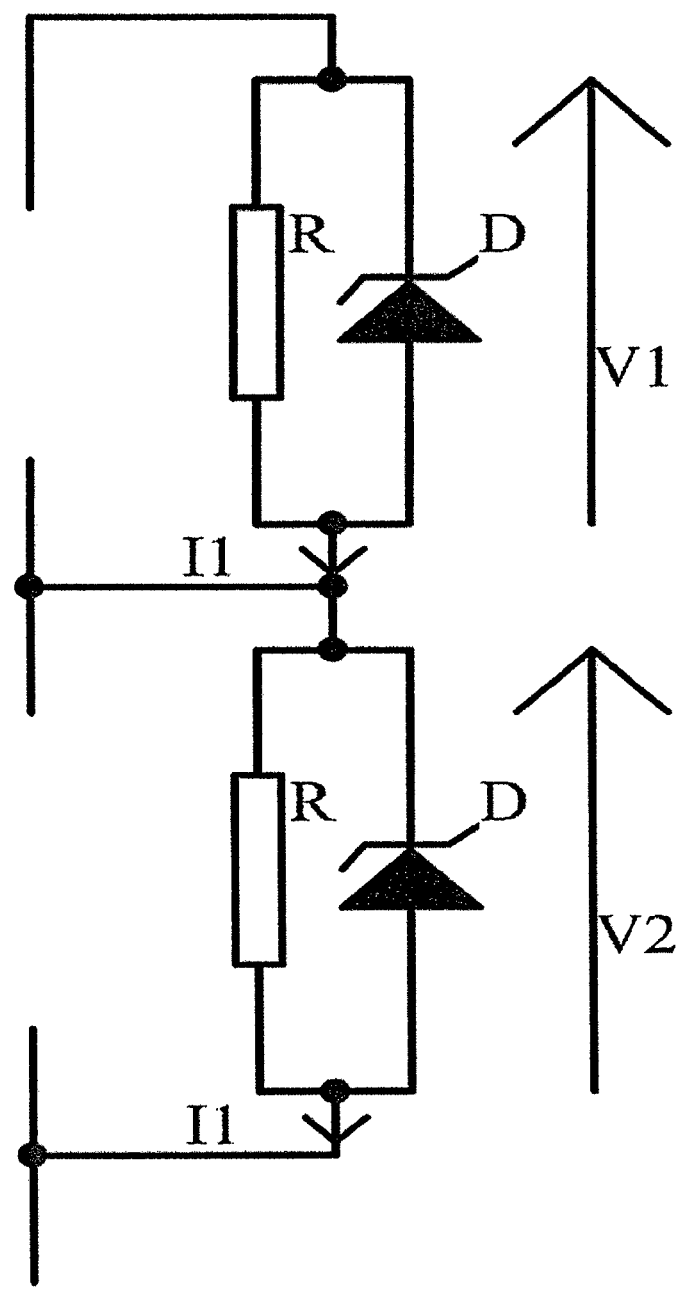
FIG. 1 represents power switching devices in the static off state (represented by open circuits) and in parallel with diverters (each represented as a resistor and transorb in parallel)
Figure 1A:
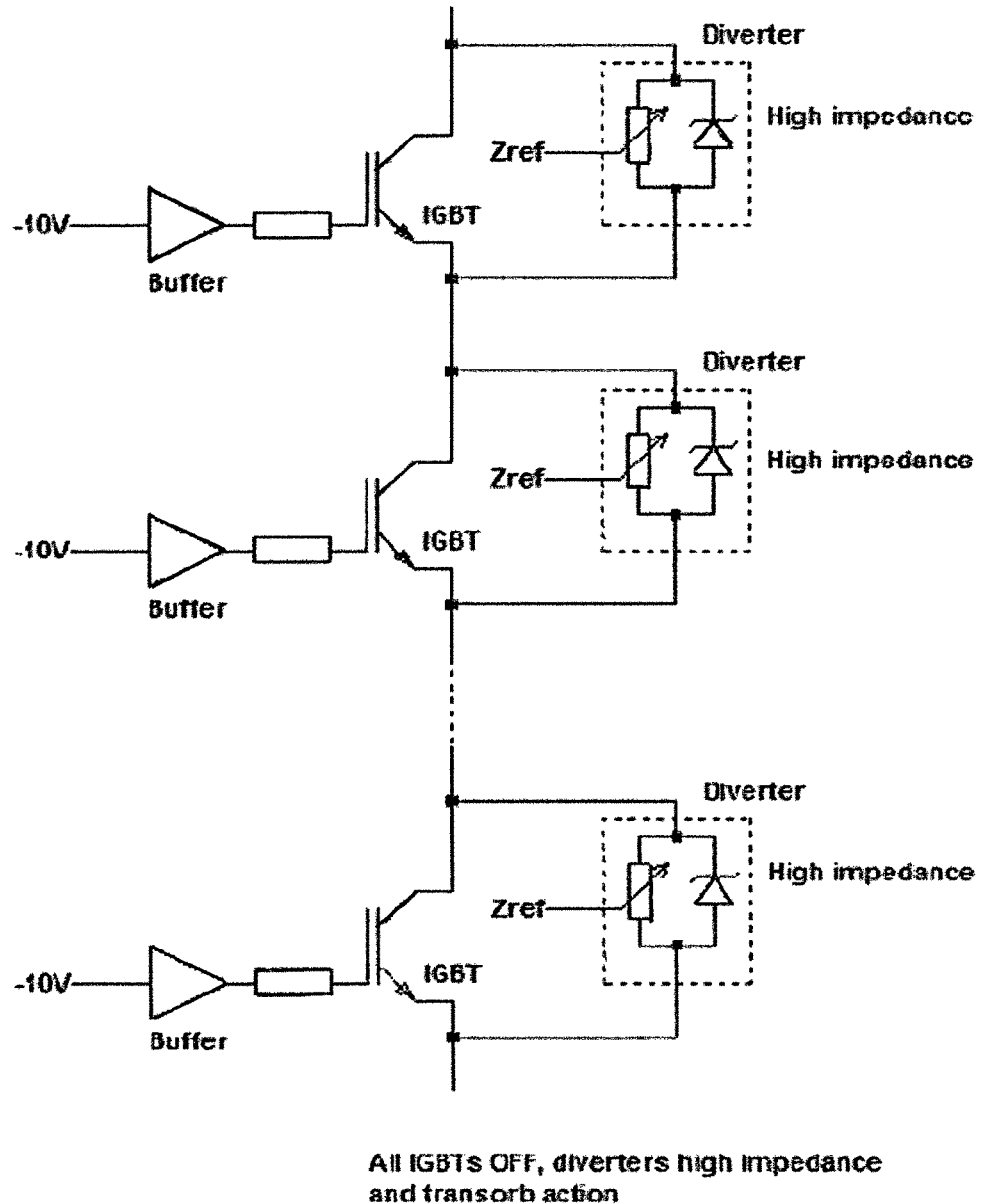
FIG. 1a similarly represents power switching devices in the static off state and in parallel with diverters (each represented as a resistor and transorb in parallel), wherein all IGBTs are off, the diverters have high impedance and transorb action occurs.

The following considers an example embodiment for control of series connected power switching devices (assumed below to be IGBTs), with reference to FIG. 1 showing diverters and power switching devices in the off state (thus represented as open circuits). A more detailed schematic of such an embodiment is shown in FIG. 1 *a*.

In the off state, series connected IGBTs generally behave like a string of capacitors, each supporting a portion of the total voltage. Due to parameter variation (e.g. leakage current) between IGBTs, the voltage across them starts to diverge as the capacitance charges and discharges. Diverter(s) may be controlled (e.g., by a signal Zref as shown in FIG. 12) at any time during static off such as at the start after dynamic turn-off to balance leakage currents and therefore equalize the voltage across each IGBT. In this regard, FIG. 1 shows a resistor and transorb in parallel for simplification of representing the diverter—the diverter circuit may comprise a single physical component which behaves as the parallel resistor transorb combination. The diverter current and/or voltage may be measured and sent back to a valve controller, so that the controller can set the target diverter resistance, current and/or voltage (e.g. voltage clamp level) appropriately.

Further concerning the start of static off, shortly after the IGBTs switch off, imbalances between large tail currents may mean that large diverter currents are required—but eventually only small currents may be needed to balance differences in leakage current between modules. One way of managing this variation is to set all diverters to low impedance initially, then higher impedance(s) over time, for example following a preset impedance profile with time or wherein the controlled impedance values of the profile and/or timings of changes in impedance are controlled dependent on diverter current and/or voltage measurements, preferably imbalance in such measurements. Such measurements from all diverters may be combined to control all diverters to follow the same impedance profiles. Alternatively, at least one of the diverters may be controlled based on measurements only of, e.g., that and/or neighboring, diverter(s). In a preferred embodiment, the valve controller sets all series diverter impedances (e.g. resistances) equally, and increases the impedance value over time when it can (e.g., dependant on current and/or voltage imbalances of the diverters as detected e.g. using sense resistors in series with the diverters) to decrease power loss.

Thus an embodiment may adjust diverter resistance to control the effects of tail and/or leakage current imbalance during the static off state, i.e., when all switching devices (e.g., IGBTs) are controlled off. Each diverter when used in parallel with a "main" switching device (i.e., the respective power switching device), may allow current to be diverted from the main switching device into the diverter. Voltage imbalances among the power switching devices may thus be reduced/avoided depending on the resulting voltages across the impedances of diverters through which the diverted currents now flow. During the static off state preferably all diverters are active and thus able to control tail and/or leakage currents. Initially each diverter may be controlled to represent a low resistance (high I/V gradient on diverter characteristic) and thus substantially conduct the tail current, to reduce development of power switching device voltage imbalances during the tail current duration. As the tail current subsides the resistance of the diverter(s) may (smoothly or stepwise) be increased to reduce losses.

In such a scheme, imbalances in tail and/or leakage currents in the devices may advantageously be detected by detecting voltage across and/or current through each diverter (rather than current through the respective power switching devices). All of the diverters may be monitored and the detection results used for control of the diverters by a central controller, e.g., using the valve controller as shown in FIG. 12. Generally, the amount of current in the diverter is relatively low, so that measuring the current in the diverter by means of a resistance in series with the diverter will result only in low loss.

Figure 11:
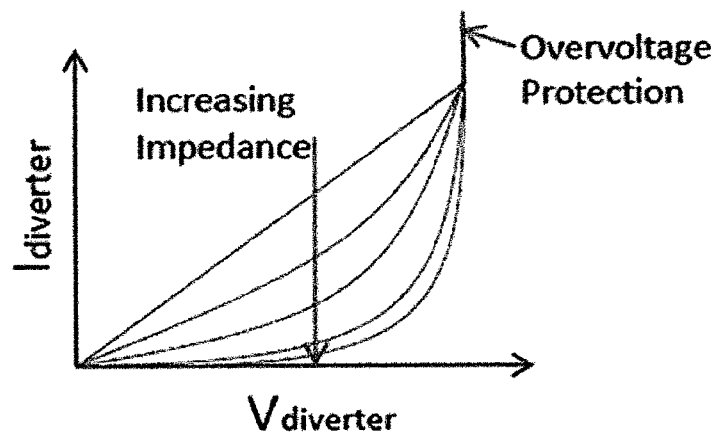
FIG. 11 shows example impedance changes of a diverter at the start of a static OFF period, the impedance increasing during tail current.
Figure 11:
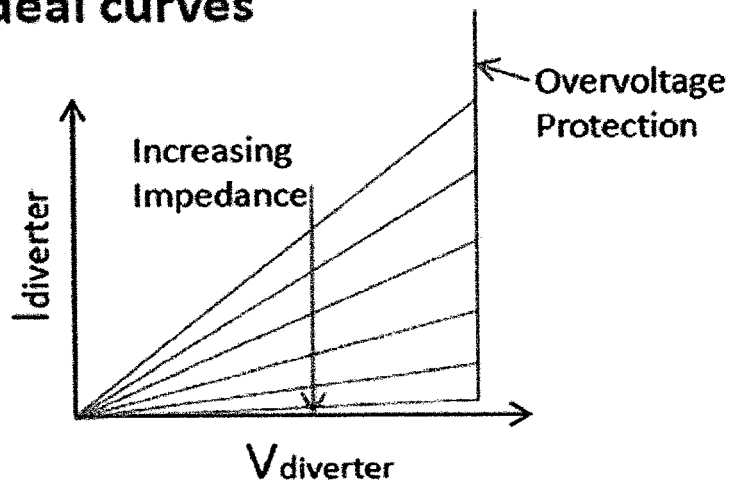

Considering timing, the diverters are preferably all controlled synchronously. Thus, all diverters may be controlled to change impedance at substantially (e.g., exactly) the same time. Such control may follow a preprogrammed profile involving two of more successively increasing resistance states for each diverter, for example states such as are shown in FIG. 11. At least one state may occur during tail current and at least one other state during leakage current. The state transitions may comprise step changes of impedance or may be smooth. As indicated above, the timing of impedance state transitions of the diverters may be preprogrammed, or may be determined in real time depending on current imbalance(s) (e.g. average or maximum differences) reflected in the detection results. Differences in the detected diverter currents and/or voltages are expected to decrease over time in each resistance state; in this case the diverters may be controlled to change to a higher resistance state when the maximum detected difference is less than a predefined amount. Such a predefined amount may be an absolute current/voltage difference or may be a fraction or percentage, e.g., of the minimum or maximum measured current/voltage. In an embodiment, the diverters could be controlled to move to a higher resistance state when a maximum difference between the diverter currents indicates a maximum voltage difference of less than a predefined amount, e.g., 5% (e.g., where −2000 V is dropped across each switching device, the diverters could be controlled to move to a higher resistance state when a maximum difference of less than 100 V is indicated).

To allow the diverters to be controlled synchronously by the central controller, a clock and/or control signal may be used for timing control in relation to diverters. Thus, the diverters may have digital timing control circuitry to receive such a clock signal in addition to Zref signals and may act upon the Zref signals at a time instant determined by the received clock and/or control signal.

Each diverter is preferably (i.e., not necessarily) off during an ON period preceding the power switching devices static off period, and turned on during turn-off of the corresponding power switching device to allow the current diversion. Alternatively, the diverter may be on during the preceding ON period, albeit with substantially zero current and zero voltage. The diverters may be turned off synchronously at any point during the static off period after the tail current has dispersed, for example at a predetermined time, e.g., 20 µS. Optionally, an embodiment may monitor rate of change of current (dI/dt) of each diverter and use, e.g., comparators and/or analog-to-digital converters, preferably at a central valve controller, to control when the impedance state transitions occur for that or all diverters).

Figure 10:
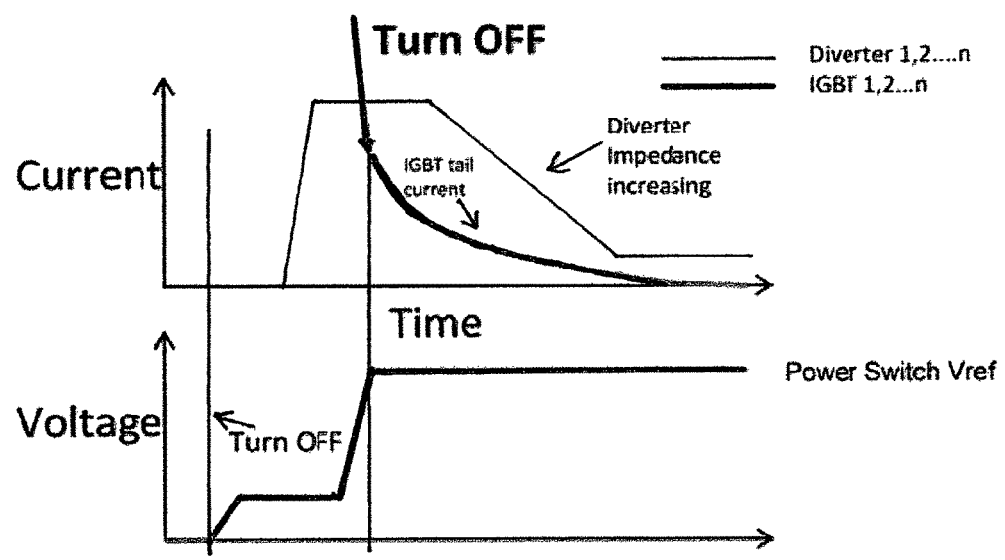
FIG. 10 shows example current and voltage characteristics at the start of a static off period.

Example current and voltage characteristics at the start of the static off period are shown in FIG. 10. As shown, the impedance of each diverter is preferably controlled to increase at least toward or at the end of the tail current. (Further increase may occur during the leakage current). This may comprise merely a single step change in impedance or multiple step changes as shown in the practical (and idealized) characteristics of FIG. 11. Alternatively the impedance increase for each diverter may be smooth and/or linear for example presenting a gradually increasing impedance at least during the end of the tail current period. Ideally the increase is controlled dependent on measurements indicating the decreasing tail and/or leakage current flowing in the diverter(s). The changes in impedance of each diverter are preferably controlled by impedance control signals Zref under the control of a central valve controller.

In view of the above, an embodiment may provide at least at the start of a static off state of the series power switching devices diverter impedance control, such that toward/at the start of the tail current the impedance of a diverter(s) is low and toward/at the end of the tail current the impedance is high. The impedance may be varied in this manner synchronously for all diverters. Furthermore, diverter impedances may be temporarily decreased and then increased at any time during static off in response to a detected imbalance.

Turn-on

For dynamic voltage balancing during turn-on, an embodiment may initially set at least one diverter current to be a predetermined (e.g., determined by preset parameters) value, and then transfer that current to the corresponding power switching device—generally assumed in the following to be an IGBT. This may avoid or reduce voltage imbalances between power switching devices due to latency during turn on, for example due to unpredictable timings of exactly when each IGBT will reach its active region.

Initially the diverters may all be in a low resistance state. The majority of IGBTs may be controlled with feedback, e.g., AVC. Other IGBT(s) (e.g. end IGBTs of the series connection) may not have any feedback loop applied to them and may be held off initially while the feedback loops are controlled by reference voltages to turn the majority of IGBTs on e.g. at least into their active operating regions. (The different treatment of the "other" IGBTs may avoid an overconstrained system, however such treatment is optional for example if there is enough resistance and/or capacitance in the circuit comprising the series connection with diverters). The gate voltages on the majority IGBTs are then held (AVC off) so that the currents in the IGBTs continue to flow. The other IGBTs may then be switched on quickly (hard switched) while the majority IGBTs continue to conduct constant current. When the other IGBT(s) are turned on, voltages across these IGBTs collapse because there is no active AVC on those devices. Once the other IGBTs are on, AVC may then be used to switch all of the majority IGBTs fully on. The impedances of the diverters may be controlled throughout the process to control currents in the series connected IGBTs.

One embodiment for dynamic voltage balancing during turn-on may implement a multistage process such as that shown in FIGS. 2 to 7, or 2a to 7a. Advantageously, such a process may ensure that no one such device switches ahead of the others, and thus that none of the devices exceeds its maximum voltage. Rather than control based on measuring the current flowing in the main current path through the power switching device, each diverter on the majority IGBTs may be used in an embodiment to pass a "known" (preset/or determined by preset parameters) current over to the corresponding IGBT. The diverter arrangements on the other, e.g. every nth, IGBT(s) may ensure the system is not overconstrained. These other IGBT/diverter part(s) may be spaced regularly or more randomly in the series connection. The controlled passing of the known diverter currents to corresponding power switching devices may allow a controlled turn-on and thus improved dynamic voltage balancing.

In view of the above, instead of attempting to perform the difficult task of controlling current in an IGBT, an embodiment performs a charge transfer. This may allow all IGBTs to effectively be brought into a final ON conduction state at the same time.

FIGS. 2 to 7 show in detail an example process involving at least n=10 power switching devices (assumed IGBTs). Since every nth IGBT in this case is treated differently, each of FIGS. 2 to 7 shows in an upper diagram an example two of the "main" (e.g., 1 to n−1) IGBTs and in a lower diagram a differently treated (nth) IGBT. Preferably, such a process may allow turn-on with low power loss. Such an example embodiment is shown in more detail in FIGS. 2a to 7a.

Figure 2:
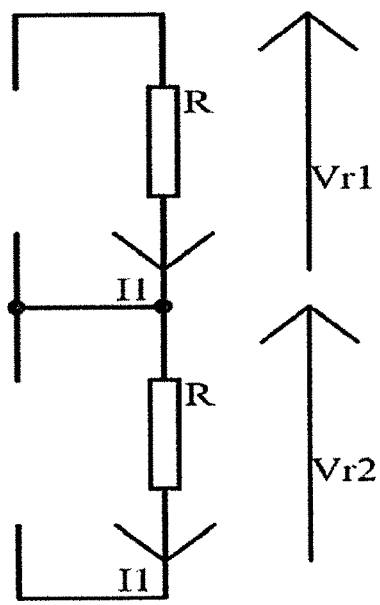
FIGS. 2 to 7 represent stages of turn on in an embodiment, wherein the upper diagrams illustrate two series-connected power switching devices and corresponding diverters (each diverter represented as a resistance, each power switching device represented as an open circuit or current source), and wherein the lower diagrams show the/each nth power switching device (represented as a short or open circuit) and corresponding diverter (represented as a resistor)
Figure 2:
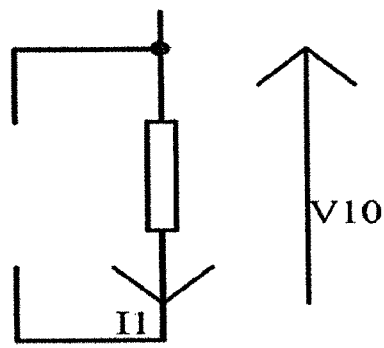
Figure 2A:
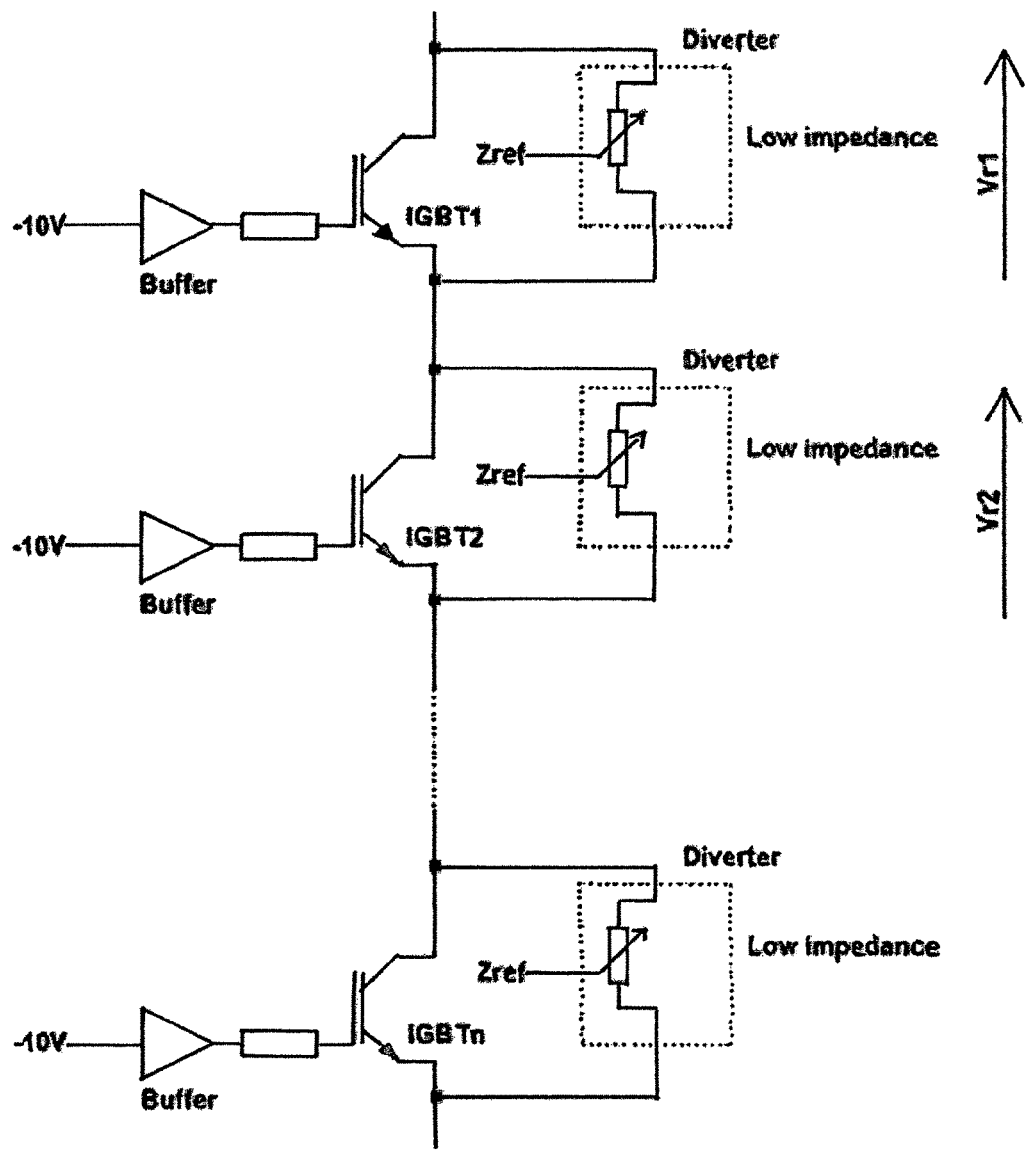

At an initial stage the power switching devices are off and thus shown as open circuits (e.g., with gate held at −10 V as shown in FIG. 2a) in FIG. 2. To share voltage each diverter R mimics a resistor (optionally further having reactive impedance) having impedance Zref (such as resistance Rfet, e.g., 100 Ohms), carrying current I1, preferably with every nth diverter set to a lower impedance, e.g., 50 Ohms. Such a lower impedance may be provided as in the following states voltage may rise due to increased current flow and some headroom may be advantageous to prevent overconstraint as mentioned above.

Figure 3:
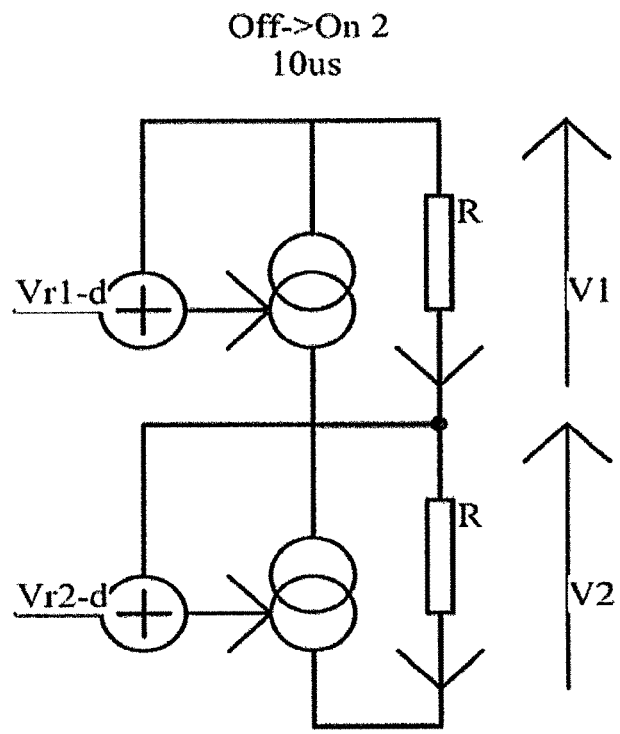
Figure 3:
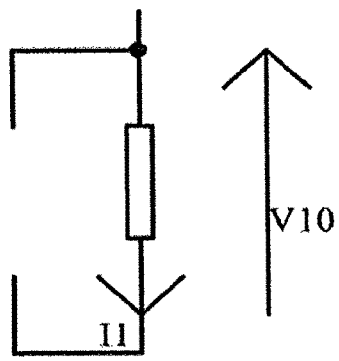

In FIG. 3, each main IGBT (now depicted as a current source) has a voltage feedback loop using the measured steady-state voltage across the corresponding diverter. The every nth IGBT(s) remains off, the corresponding diverter in this case having a low resistance such as 50 Ohms. For each main IGBT, the set point for the feedback control is the diverter voltage (Vr1 . . . Vr9) minus a small voltage difference (d), e.g., 50 V. The small voltage difference forces the feedback loop to become active, which in turn drives current into the IGBT which starts to turn it ON. Preferably, the set point (reference) is determined by a controller (e.g., central valve controller) receiving the diverter voltage, the set point then output from the controller to control the IGBT. Such a controller may be similarly coupled to all diverters and corresponding IGBTs as shown in FIG. 12.

Figure 4:
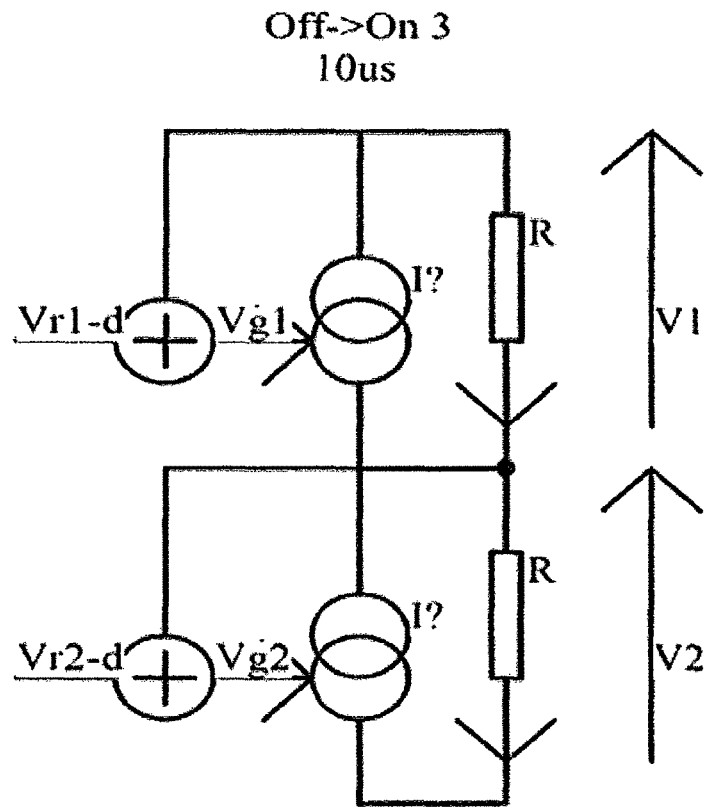
Figure 4:
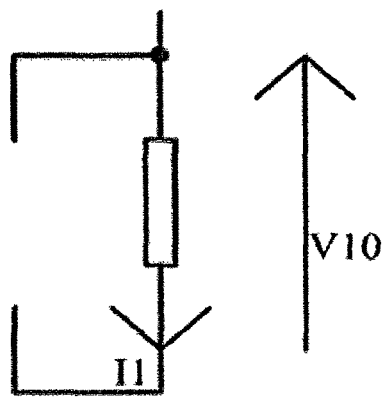

FIG. 4 shows that after the feedback loops for the main IGBTs have stabilized—this may be identified by at least one of the voltages (e.g., Vr1, V2 etc.) dropping by a predefined amount or portion of the small difference, e.g., by at least d/2—the diverter resistance values for the main IGBTs are increased, e.g., by a factor of 10 in this case to 1000 Ohms. Each main IGBT may then be forced to take the current from the corresponding diverter. At this point all IGBTs (except every nth) are active and conducting a small, but preferably measured (substantially (e.g. fully) determined by preset parameters amount of current. The nth IGBTs remain off and the nth diverters still appear as low impedance resistors, advantageously ensuring the system is not over constrained. Without the nth IGBT(s) being different at this point, then the whole system behavior may be set both by the valve voltage and also by the sum of the feedback voltage settings. If either of these constraints were changed, the current flow may change rapidly. (Without any IGBT lacking an operational feedback loop in an embodiment, a change in one part of the chain of IGBTs and diverters may cause instability across the whole chain. Having at least one, e.g., every nth, IGBT lacking such a loop, any instability may be confined to those IGBTs and diverters having feedback, i.e., may not extend to the entire chain).

Figure 5:
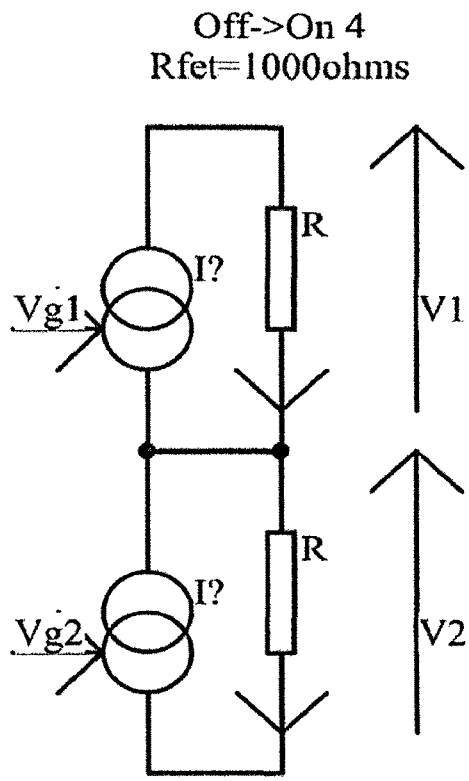
Figure 5:
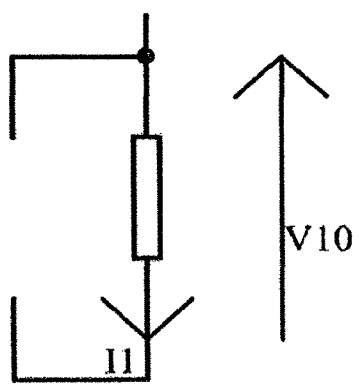

In FIG. 5 the gate voltages on the 1 to n−1 IGBTs are held at the levels set by the feedback loops. Generally this will ensure the current cannot rise.

Figure 6:
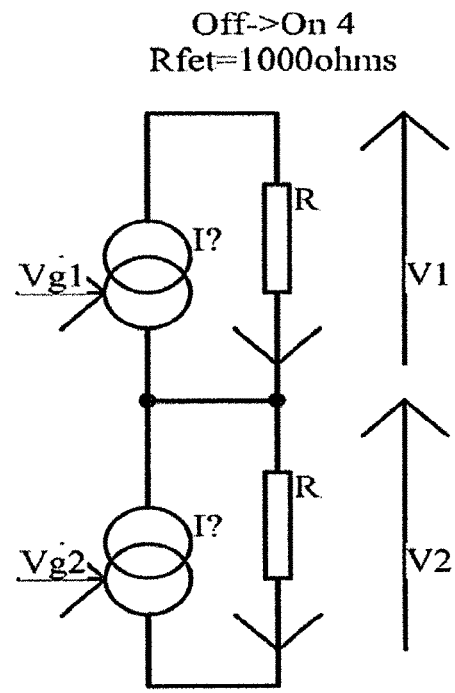
Figure 6:
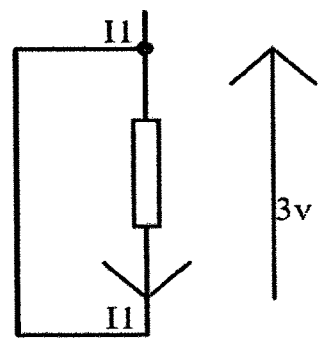

In FIG. 6 every nth IGBT is turned ON thus having low resistance (shown in FIG. 6 for ease of representation as a short circuit (shown alternatively as an IGBT having +15 V on the gate in FIG. 6a)—having no feedback applied to these IGBTs, their voltages may collapse at this point). In the example, 3 V is dropped across the nth diverter which at this stage continues to have the low resistance, e.g., 50 Ohms.

Figure 7:
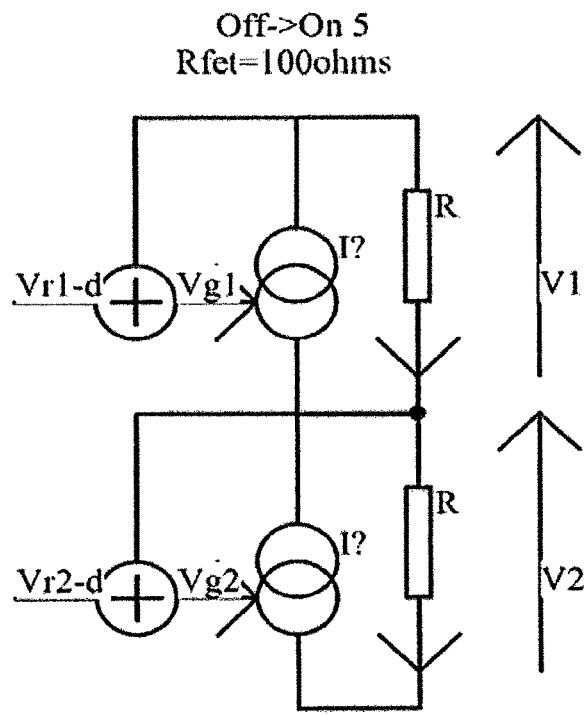
Figure 7:
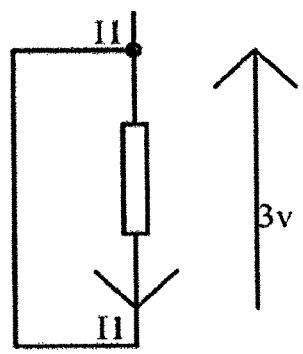

Subsequently, as shown in FIG. 7, IGBTs 1 to n−1 are turned fully ON, by enabling the voltage feedback loops around them, and decreasing the references (Vrx−d; x=1 . . . n−1). FIG. 7 shows synchronous turn on of the main IGBTs.

At least one of the steps of FIGS. 2 to 7 (or FIGS. 2a to 7a to which generally the above description further applies; or FIGS. 1 to 7 or 1a to 7a), preferably all such steps, are performed synchronously (e.g., exactly simultaneously) across the chain of at least the 1 to n, preferably all, power switching devices.

Figure 7A:
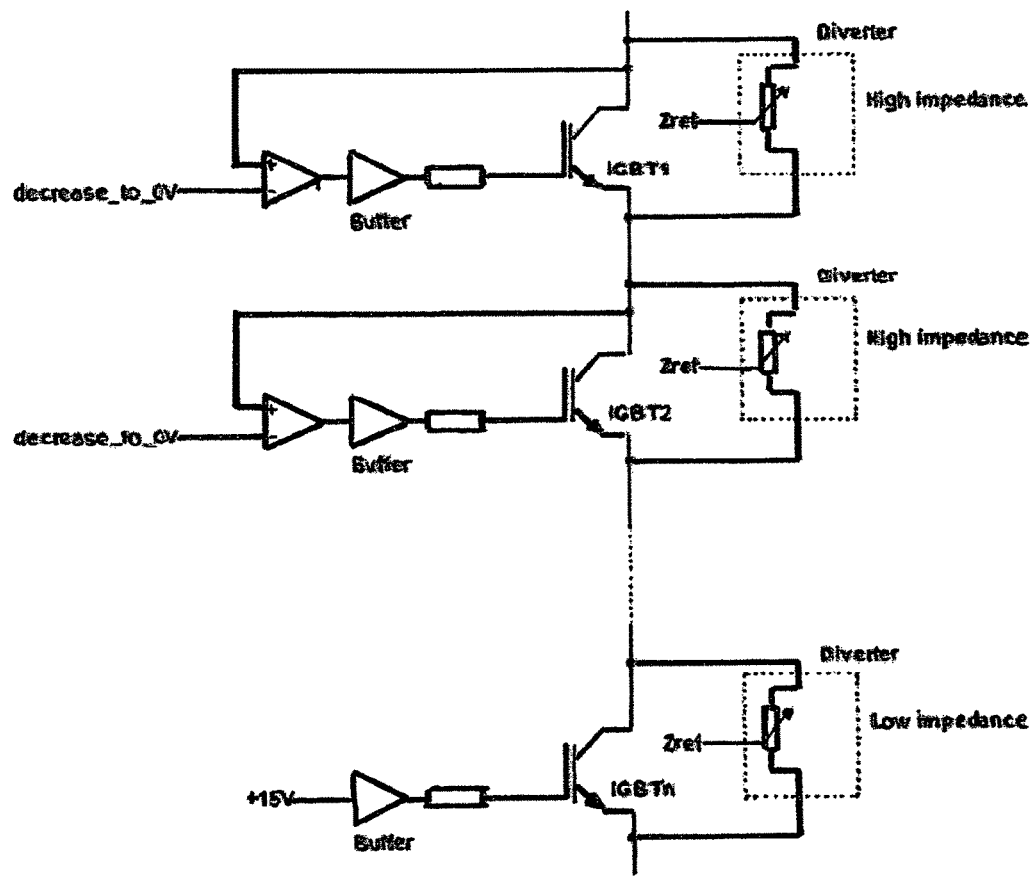
Figure 8:
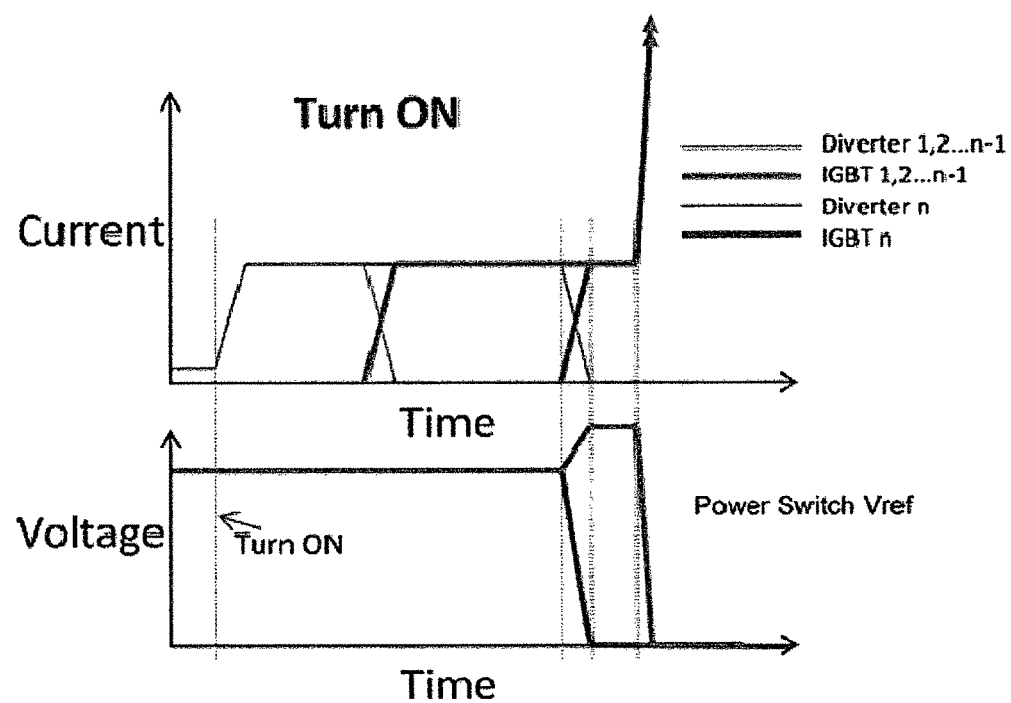

Representations of the voltages and currents on the IGBTs and diverters in the process of FIGS. 2 to 7 or 2a to 7a are shown in FIG. 8. As described above, at an early stage all of the diverters are set to low resistance thus conducting current. Subsequently the resistances of the 1 . . . n−1 diverters are increased, their conduction decreases and current flow in the corresponding IGBTs increases. At a later time the nth IGBT(s), which may lack any feedback loop, are turned on so that voltage across the nth IGBT(s) falls and there is corresponding decrease of current through the nth diverter. Equal current may flow in all of the series IGBTs when the 1 . . . n−1 diverters are finally switched to fully on.

As an alternative to the feedback loop(s) such as shown in FIG. 7 or 7a, at least one diverter could be reused as a voltage clamp to the gate of the corresponding IGBT, to allow IGBTs 1 to n−1 to be switched synchronously. Such a voltage clamp may ensure no IGBT can go overvoltage. Thus, a mechanism to switch synchronously could either be with a feedback loop, i.e. Active Voltage Control (AVC) or more simply using the diverters as clamps to prevent any IGBT from overvoltaging, and switching them off open-loop (no AVC). The synchronous turn on and turn-off could be achieved using either mechanism depending on whether the diverters are configured to allow AVC or to act as clamps (see FIG. 13a).

Figure 3A:
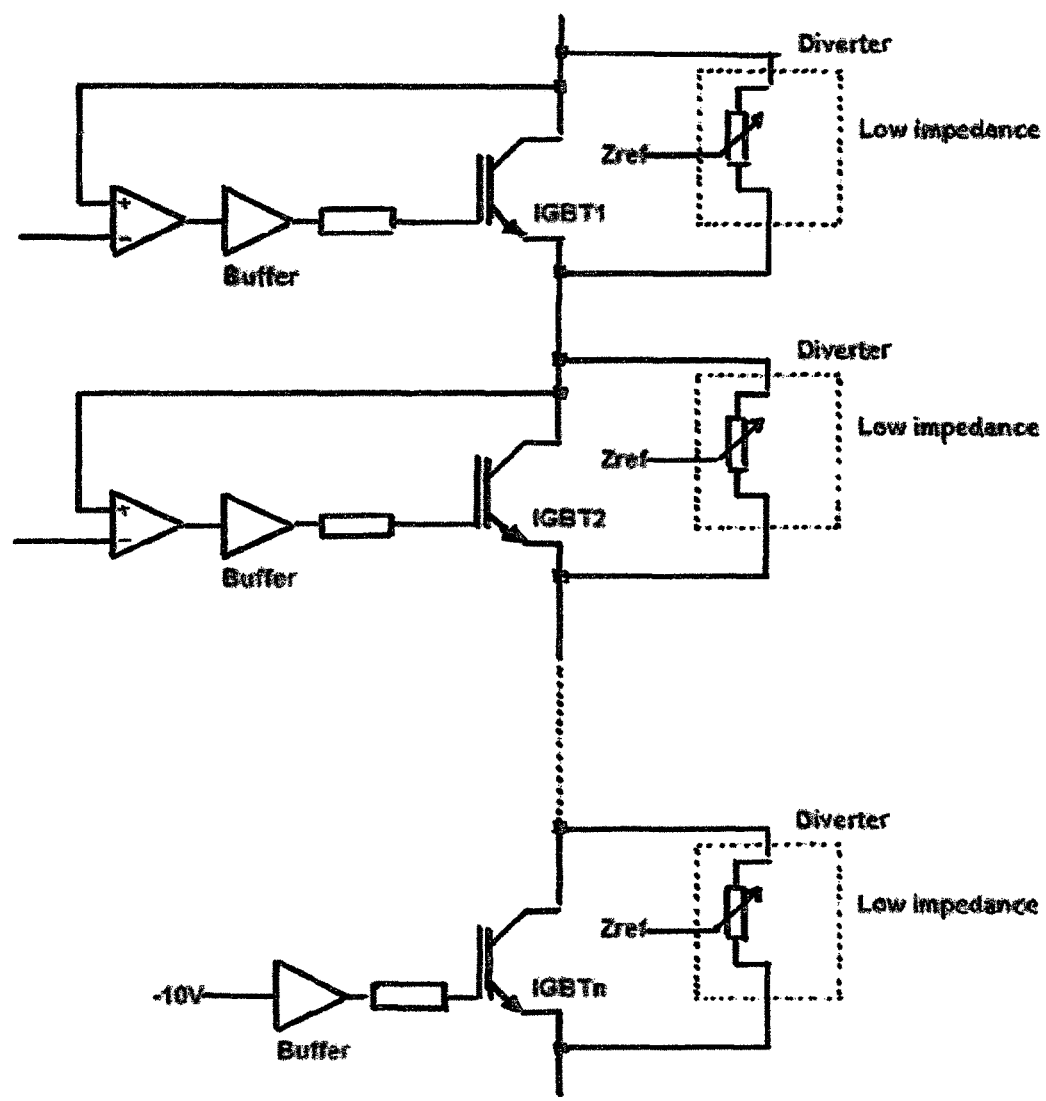
Figure 4A:
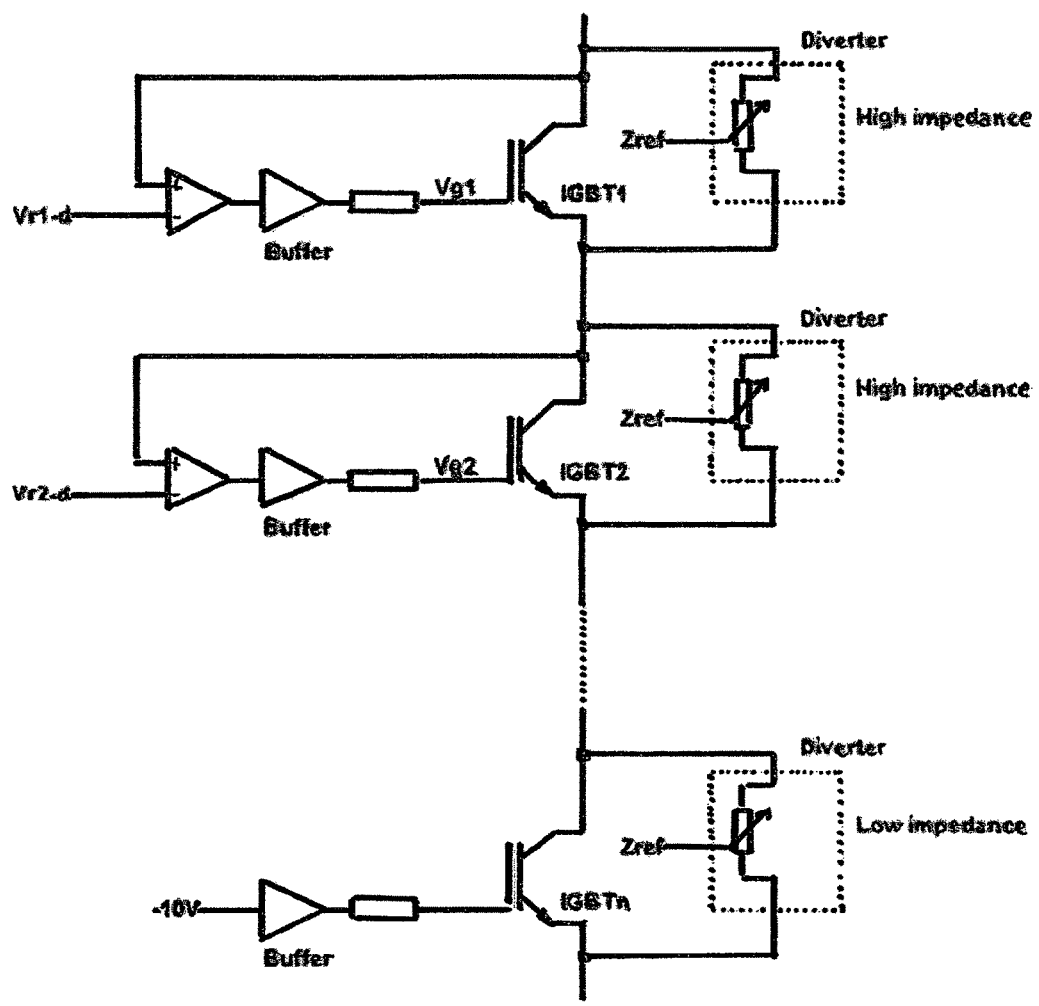
Figure 5A:
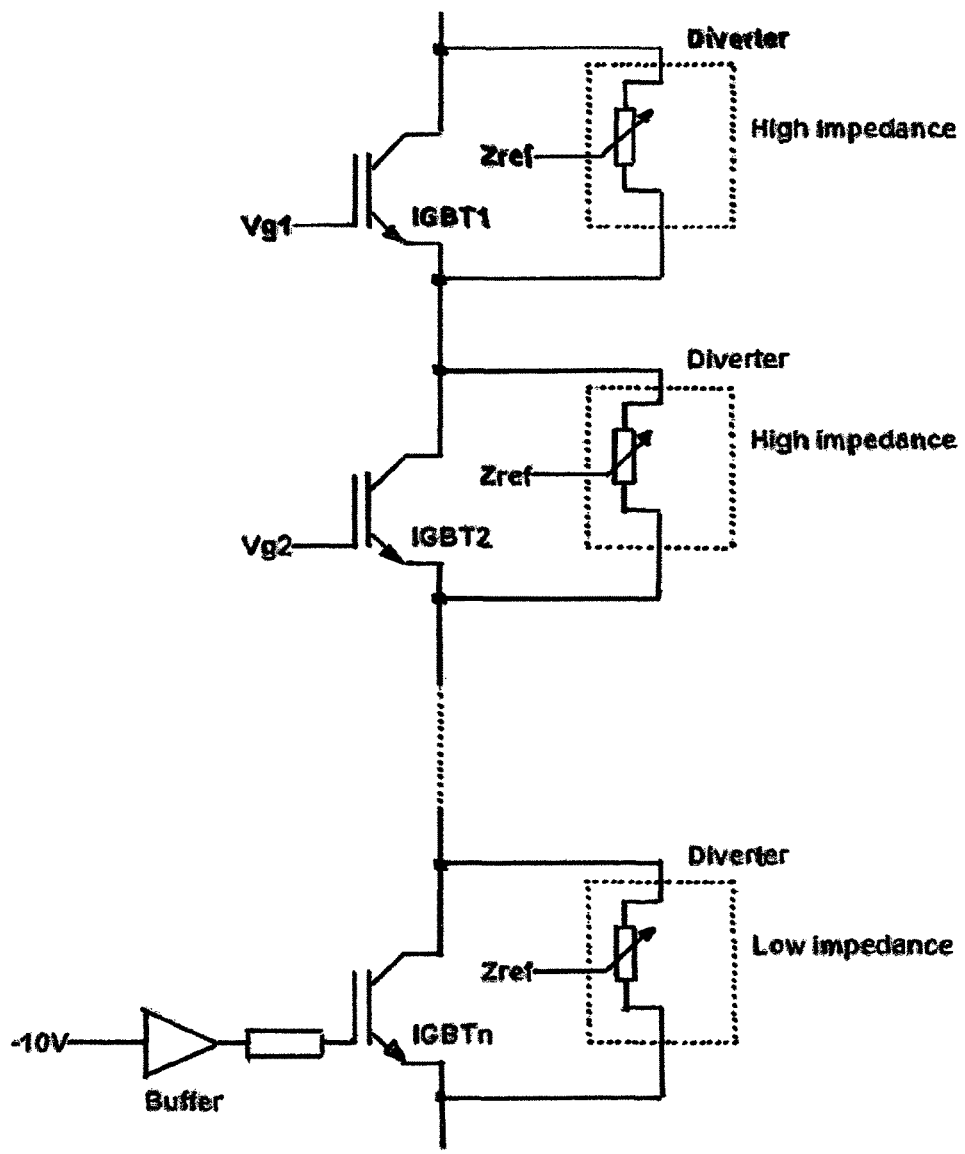
Figure 6A:
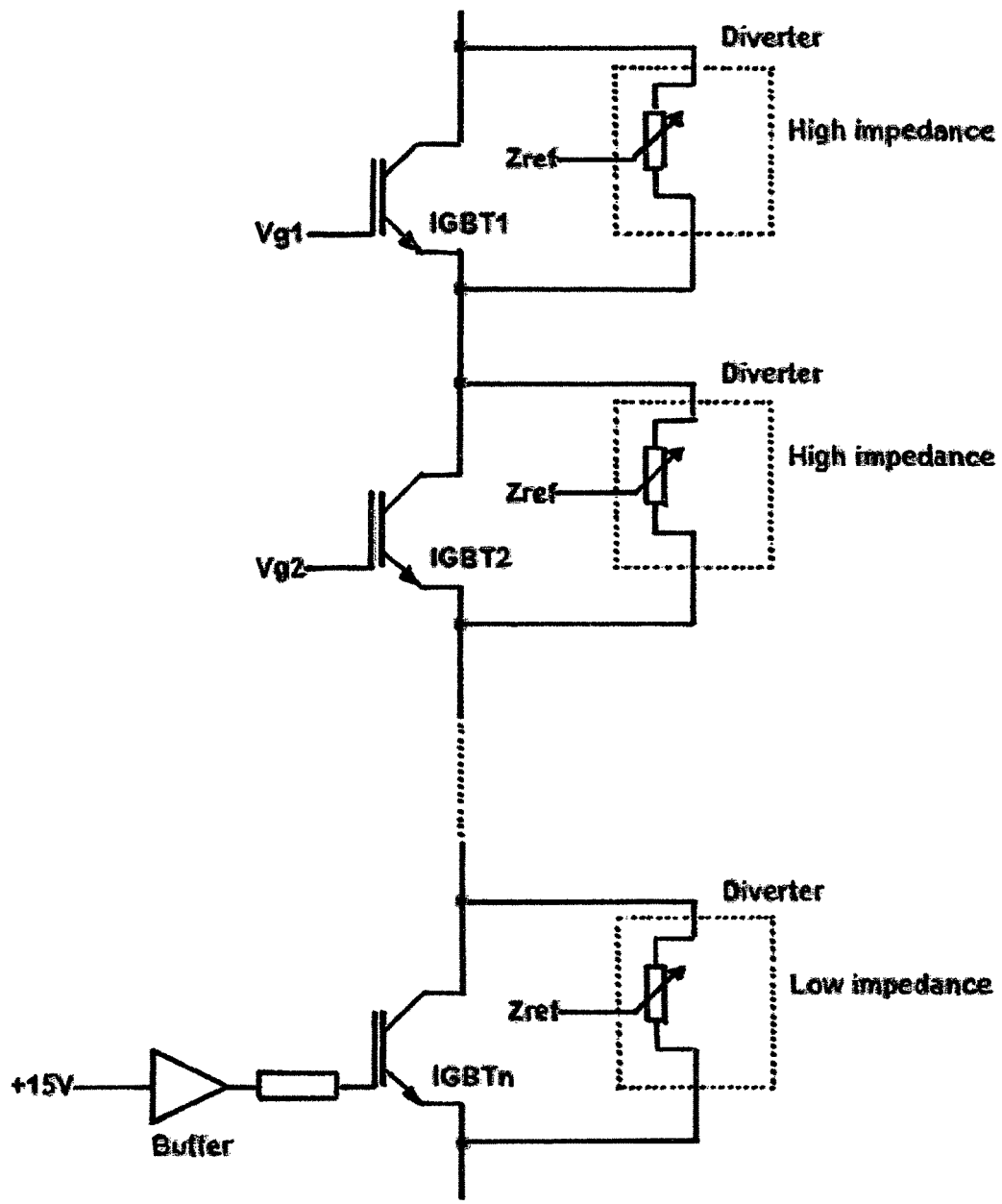

It is noted that FIGS. 2a to 7a show an example turn-on process in more detail than FIGS. 2 to 7. In FIG. 2a, all IGBTs are off and the diverters have low impedance. In FIG. 3a, IGBTs 1 to n−1 have voltage feedback and the diverters have low impedance. In FIG. 4a, IGBTs 1 to n−1 have voltage feedback, the diverters have high impedance and current transfers to IGBTs. In FIG. 5a, for IGBTs 1 to n−1 the gate is held at constant voltage so that each such IGBT holds constant current. In FIG. 6a, IGBT n is turned ON. In FIG. 7a, IGBTs 1 to n−1 are synchronously turned on by reducing Vref.

Static On State

Figure 16:
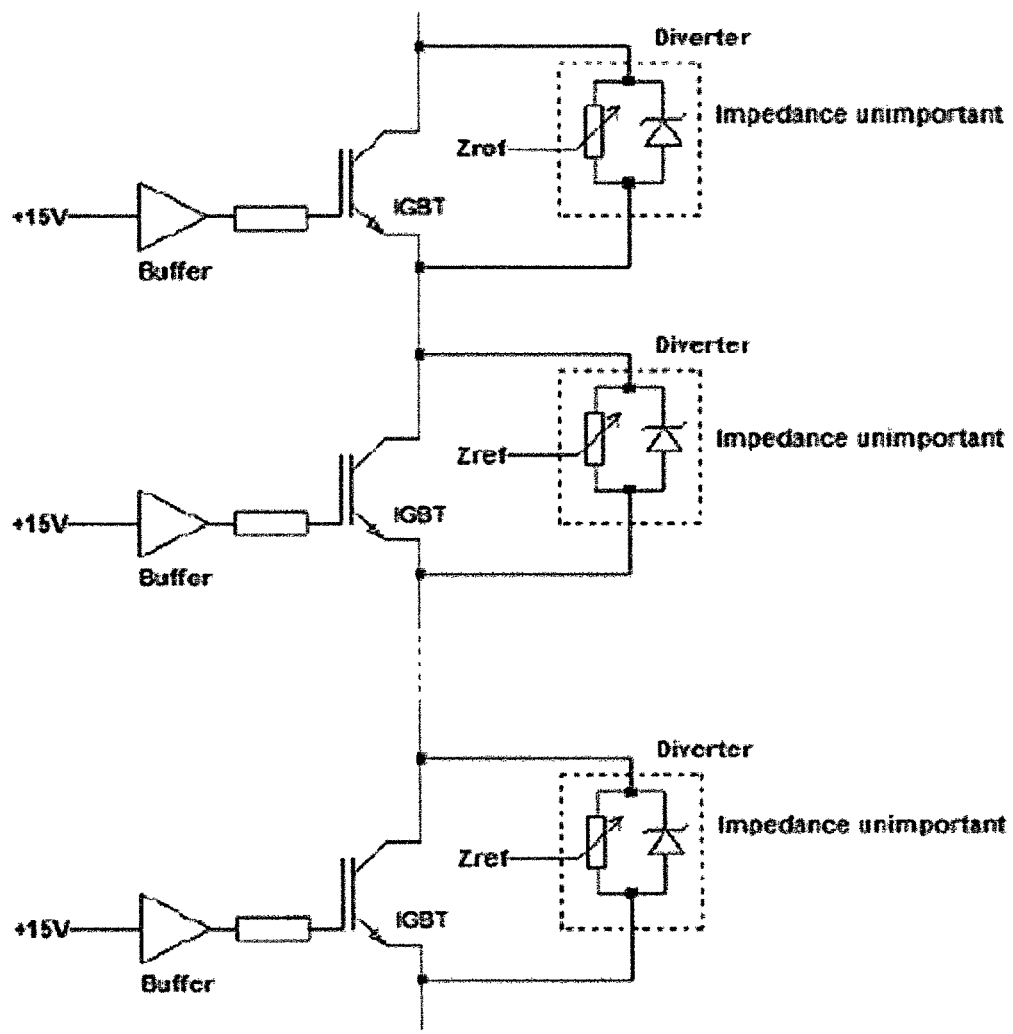
FIG. 16 represents power switching devices in the static ON state and in parallel with diverters (each represented as a resistor and transorb in parallel), wherein all IGBTs are ON and impedances of the diverters is unimportant.

Generally, all of the series power switching devices, e.g, IGBTs, are ON in the static ON state as shown in FIG. 16. Each diverter however may be ON (low impedance) e.g., to provide a marginal efficiency saving, or off (high impedance) to allow it to cool.

Turn-off

Figure 13A:
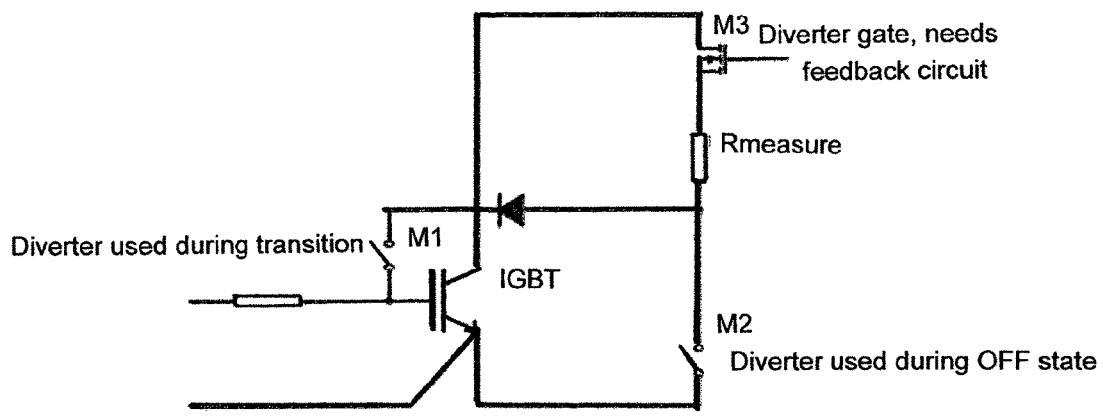
FIG. 13a shows an example arrangement for reuse of any diverter of FIGS. 1 to 7 and/or 2a to 7a, 9a, 9b and 12. Similarly to FIG. 11, an idealized set of I-V curves show example impedance changes of diverter M3.

A further or alternative use of an above-described diverter is envisaged in relation to dynamic voltage balancing for turn-off. Specifically, diverters, e.g., transistors, are connected instead as voltage clamps as shown by diode elements D in FIGS. 9a and 9b (similarly voltage clamp may be achieved using the circuit shown in FIGS. 9c and 9d). Additional switch(es) may be used to reconfigure a diverter for such use, similarly for example as shown in FIG. 13a or 13c.

Switching from the ON state to an off state may be a multistage process, preferably to ensure that no one power switching device, e.g., IGBT, switches ahead of the others, otherwise some IGBTs could exceed their maximum voltage.

Figure 9A:
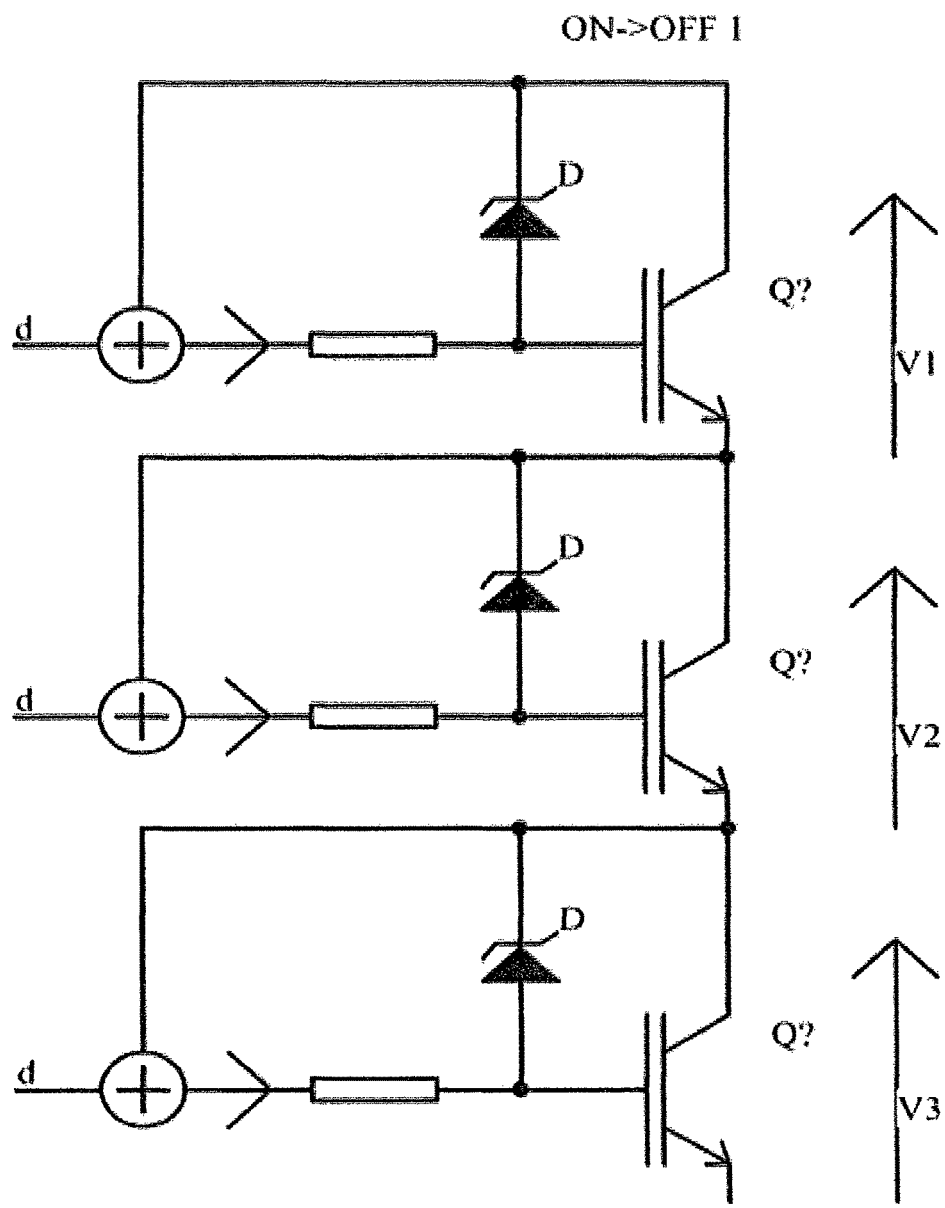
FIGS. 9a, 9b together show example steps of turn-off of feedback controlled power switching devices, wherein the feedback loop comprises a difference amplifier (represented as a circle with + sign) and each diverter is acting as a controllable voltage clamp (represented by a transorb D). The difference amplifier is omitted in FIG. 9b since in this state the power switching devices IGBTs are switched off and the feedback loop is not active.
Figure 9B:
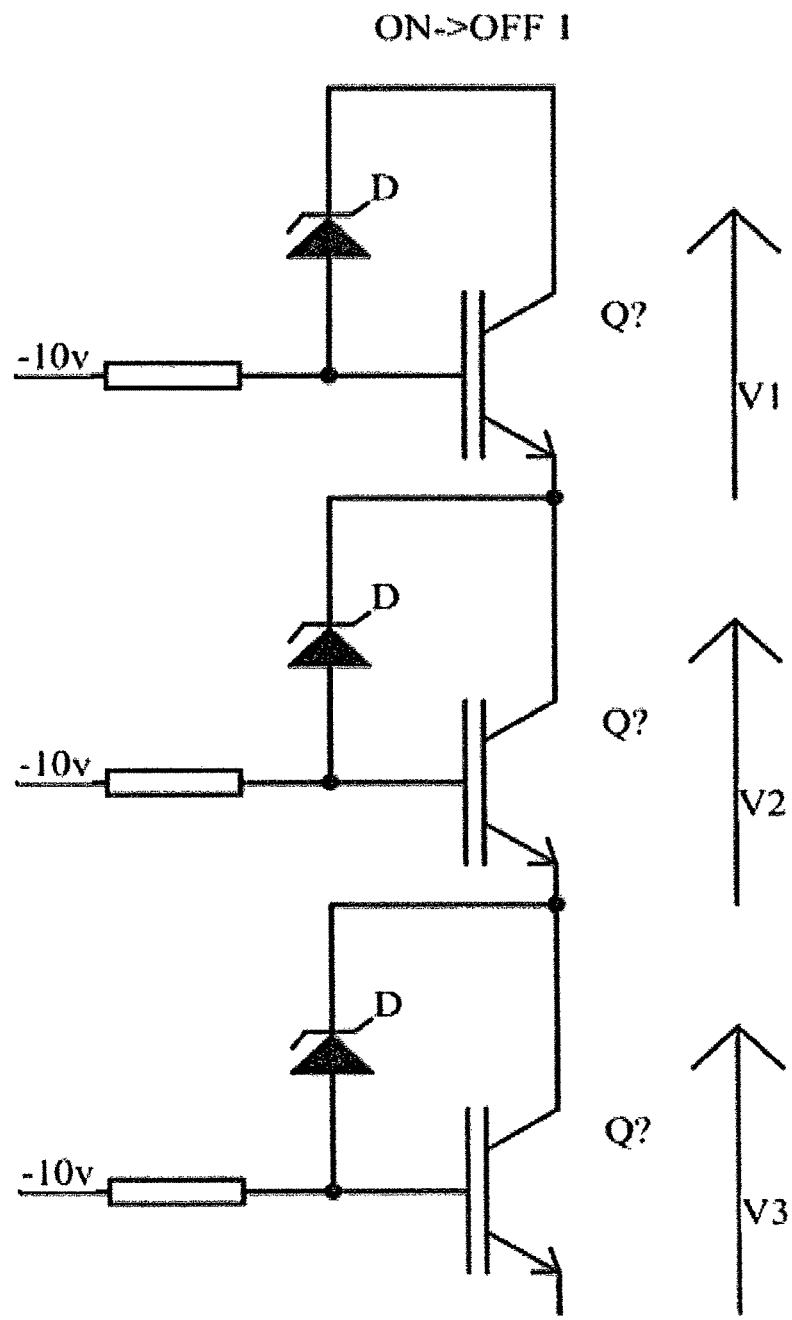
Figure 9C:
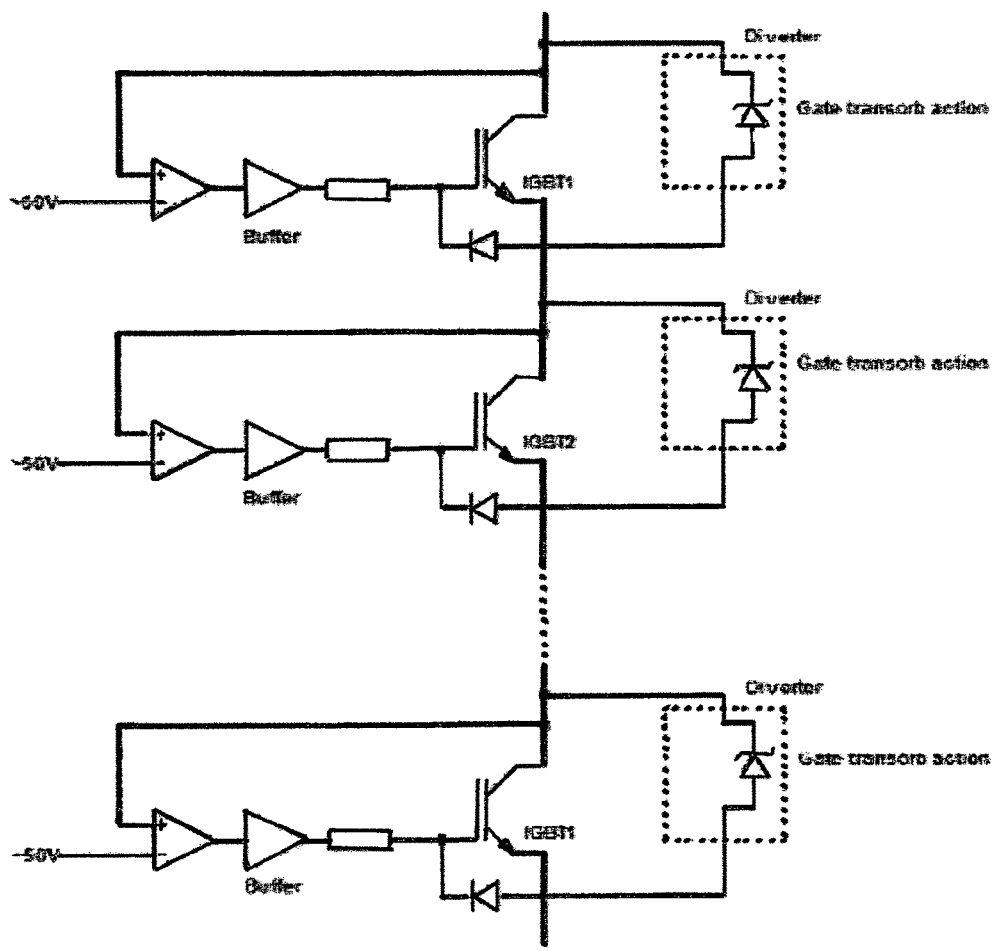
FIGS. 9c, 9d similarly together show example steps of turn-off of feedback controlled power switching devices, wherein the feedback loop comprises a difference amplifier and each diverter is acting as a controllable voltage clamp (represented by a transorb). The difference amplifier is omitted in FIG. 9b since in this state the power switching devices IGBTs are switched off (−10 V) and the feedback loop is not active.

In an example such process, and as shown in FIG. 9a or 9c, the first step may be to bring the power switching devices (assumed below to be IGBTs) into their active region. With the diverter configured, e.g., using switches such as M1 and/or M2 of FIG. 13a or 13c, as a voltage clamp to ensure no device switches off early and takes all the voltage, a small voltage difference (e.g. 50 V) is applied, e.g., by adjusting a reference voltage to a difference amplifier, for a set point. As a result of the feedback, the IGBT develops a small voltage across it and it starts to become active.

FIG. 9b shows that this is followed by synchronously switching all IGBTs off (e.g., using a resistive drive turn-off), still using the diverter as a voltage clamp (to the IGBT gate) to prevent overvoltage. (As an alternative, Active Voltage Control can be used in this phase, for example using the feedback circuit as shown in FIG. 7 or 7a).

After this, all diverters are used directly across the supply, to ensure sharing. FIG. 10 shows a diverter current-voltage profile which may be applied during dynamic turn-off and the start of static off (having a tail current as noted in FIG. 10). The profile generally matches a resistor in parallel with a transorb. Initially the resistance chosen is low, and over time as the IGBT tail current imbalances fall, the chosen mimicked resistance/impedance increases in order to decrease the diverter losses, as described above in relation to static off.

Figure 9D:
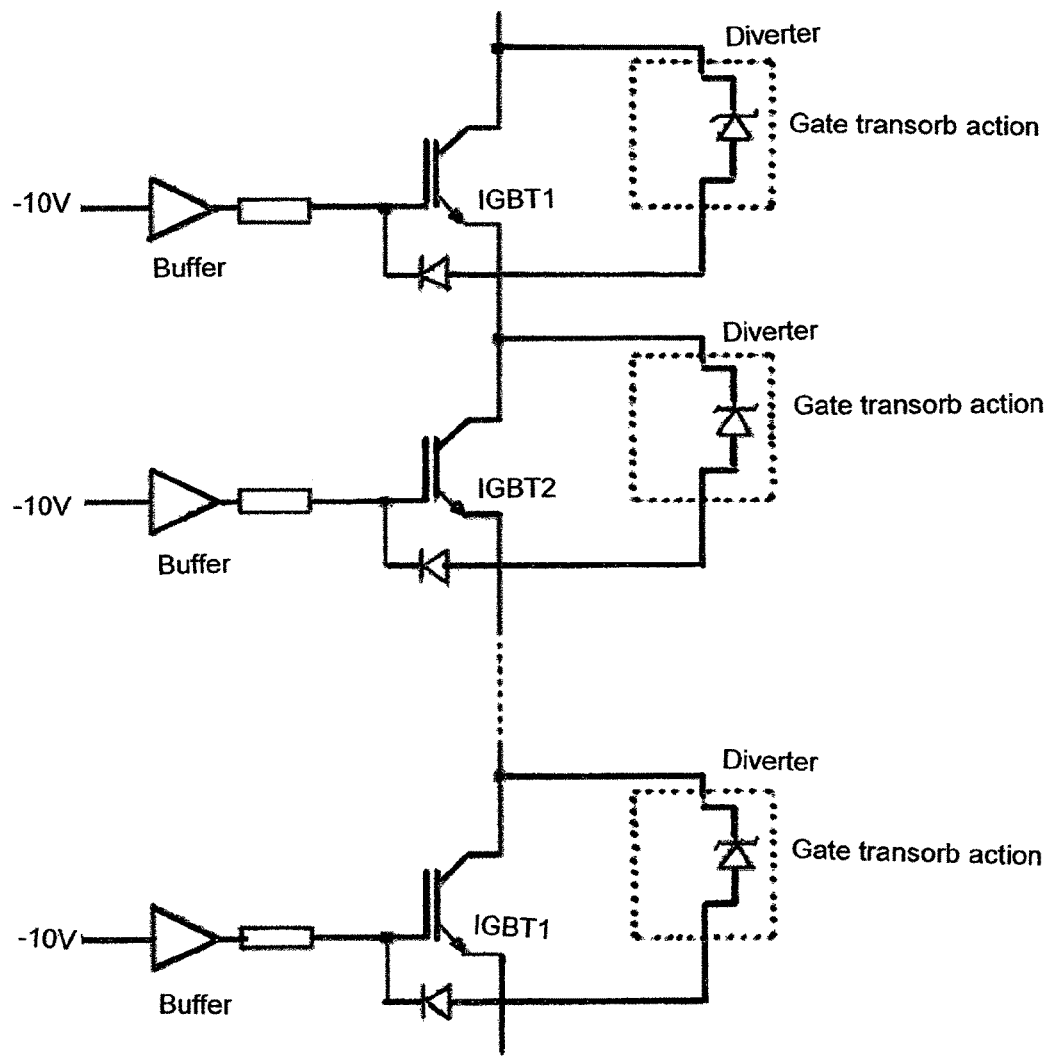

It is noted in comparison to FIGS. 9a and 9b that FIGS. 9c and 9d similarly together show example steps of an on-off transition, with more detail. In FIG. 9c, all IGBTs are in voltage feedback at low voltage and diverters act as transorbs to the gates. In FIG. 9d, all IGBTs are switched off synchronously (e.g., exactly simultaneously) and diverters act as transorbs to the gate.

Slow Turn On for Zero Voltage Switching Applications

Series connected gate drives may generally be designed to switch at zero voltage (e.g., in VSC HVDC Gen 2), except under certain fault conditions. This may mean the off-ON transition does not burn significant power, and in the general case there is >10 s in which to make the transition and still stay within the safe operating area (SOA) of a power switching device such as an IGBT.

Whilst voltage feedback at high volts does burn power (this may be one of the main disadvantages of AVC in hard switched converters), in soft switching converters the transition can be relatively slow without a significant impact on efficiency. Slowing down the transition may mean the feedback circuit needs only low gain, so poor tracking of the reference voltage, but good stability and/or low overshoot.

The integral action of the, e.g., IGBT, gate when driven with a constant current source is highly suitable here. With very low loop gain (e.g. 0 to 20 dB at 1 MHZ) the loop will stabilize in approximately 1 to 100 s. If IGBTs are not perfectly synchronized, the diverter(s) (acting as voltage clamps) may inject current into the gate of late IGBTs and accelerate the turn on. When IGBT/diverter parts are synchronized they may be switched together using the transorbs/diverters for overvoltage.

Thus, diverters configured as voltage clamps (e.g., from collector to gate of a power switching device) preferably using switches such as M1 and/or M2 of FIG. 13a or 13c, may be advantageously used with zero voltage switching and/or low gain feedback (e.g., AVC). This may be applied in an embodiment with any other use of the same or additional diverters as disclosed herein.

Open Loop Turn-on

If the power switching devices, e.g., IGBTs, are found to be synchronized within ±100 ns of each other (e.g., because the module characteristics such as capacitance are sufficiently uniform), then they can be switched open loop, preferably using diverters to function similarly as transorbs (transient voltage suppression diodes) back to the respective gates. An example configuration to allow this is shown in FIG. 13a or 13c, with M1 and/or M2.

Once the valve is operational, the switching timings can be adjusted to reduce any skew.

The first switch on may be a more difficult process—however in the off state some devices can be momentarily switched ON to measure the latency, such as that described above in relation to the slow turn on. Timing measurements to indicate latency, obtained for example by detecting timing of voltage transitions across the IGBT, may be used by a preferably central controller to adjust timings of respective turn-on signals to the respective diverters.

Nonlinear Resistor

It may be preferable in embodiments for each diverter to mimic an impedance such as a nonlinear resistor rather than a conventional resistor that conforms to Ohm's law. For example this could be $RaV^2$ (V being voltage across a diverter), or some other function. Embodiments may require very low current at low diverter voltage, but lots of current at higher voltage. It is desirable to stabilize the power switching devices string voltage quickly (i.e. have the minimum dynamic resistance in an embodiment), but when close to stable the static diverter current is preferably very low. It is preferable for this process to be automated per IGBT, rather than to rely on constant communications with the valve controller.

Thus, each diverter for at least dynamic turn-on voltage balancing of power switching devices (e.g., each 1 . . . n–1 diverter in FIGS. 2 to 7 or 2a to 7a) may be controlled based on diverter current and/or voltage feedback to a central controller to have nonlinear resistance.

Reuse of the Diverter Power Semiconductor

It may be desirable to allow configurable reuse of at least one diverter, e.g., for the static off state and/or dynamic switching transitions, for example as shown in FIG. 13a or 13c. This may be advantageous if the power semiconductor device used for the diverter is expensive (e.g. 4.5 kV 100 A peak FET).

In FIG. 13a (and similarly FIG. 13c) there are two low voltage MOSFETs, M1, M2, and one high voltage "Diverter MOSFET", M3 connected to a power switching device, e.g., IGBT, collector. The two low voltage MOSFETs configure the use of the diverter MOSFET, preferably as either an active transorb-like device to the IGBT gate or for use directly across the IGBT itself.

During the off stage, M2 is turned ON, and M3 is used in the linear region directly across the IGBT to balance the voltages as described in relation to static off above. M3 could be used to mimic an impedance such as a resistor (linear or nonlinear), by using a feedback loop around it to maintain the voltage across Rmeasure to be a fraction of the collector voltage. The skilled person will realize that other linear and nonlinear functions may be used to achieve closer to a transorb I-V characteristic however.

During turn-on and turn-off transients, M1 is preferably turned ON, such that M3 could be used in the linear region as a programmable voltage clamp.

M1 could be directly connected to the IGBT gate, or via a buffer pair of emitter follower transistors if need be to reduce clamping losses in M3.

Figure 13B:
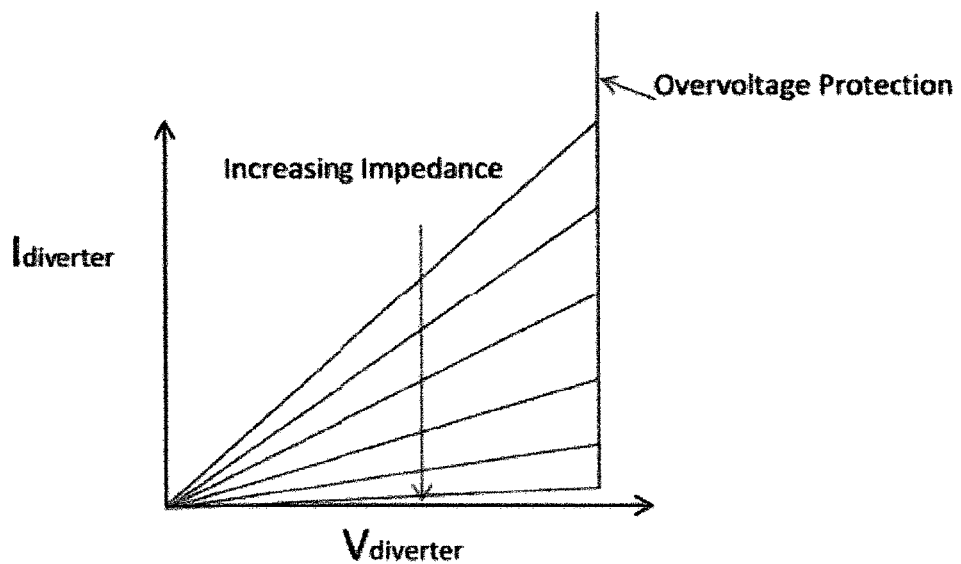
FIG. 13b shows an example current-voltage profile of the diverter M3 for voltage balancing at, e.g., the start of static off.
Figure 13C:
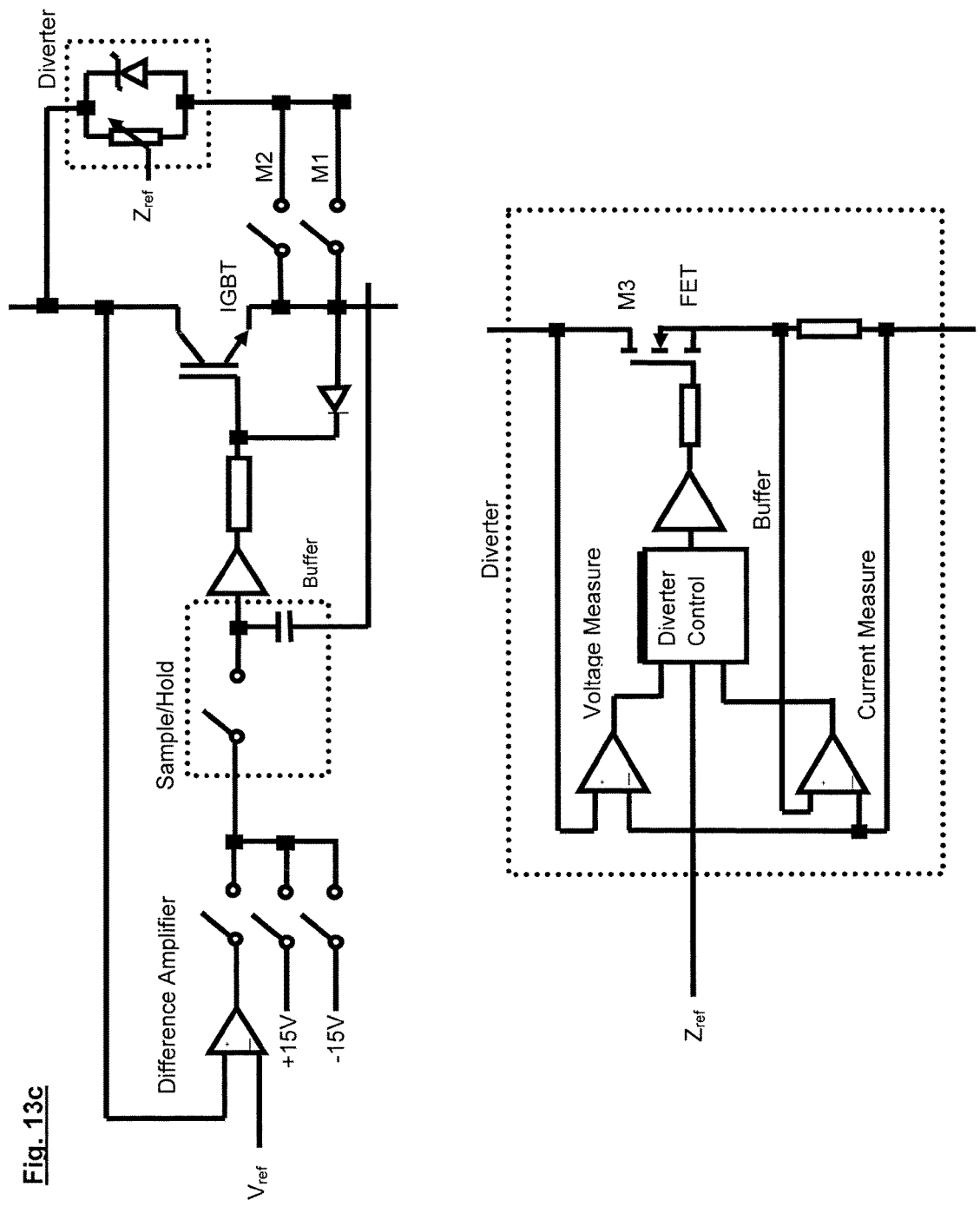
FIG. 13c similarly shows an example arrangement for diverter reuse of any diverter of FIGS. 1 to 7 and/or 2a to 7a, 9a, 9b and 12, the diverter circuitry comprising FET M3, a voltage measurement circuit, a current measurement circuit and diverter control block.
Figure 14A:
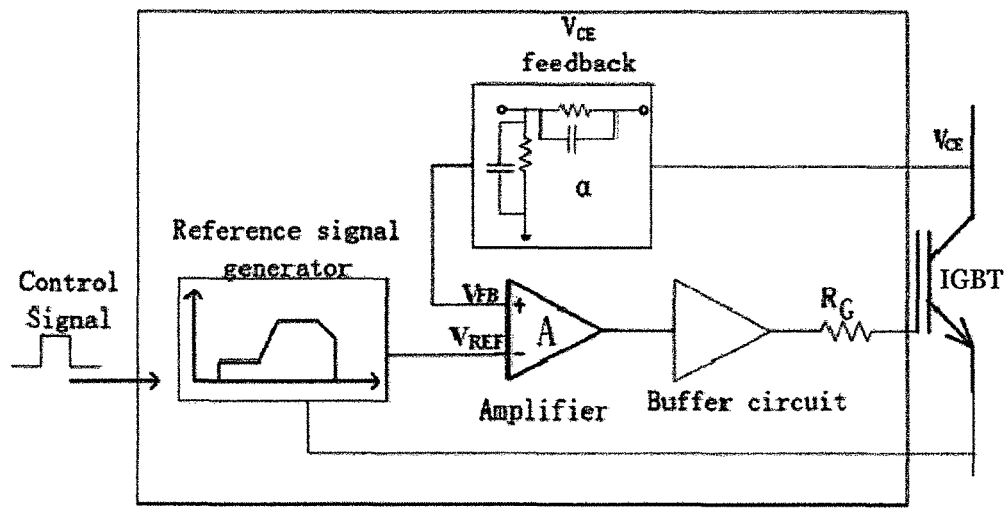
FIGS. 14a, 14b show, respectively, an Active Voltage Control (AVC) circuit and a Cascade Active Voltage Control (CAVC) circuit.
Figure 14B:
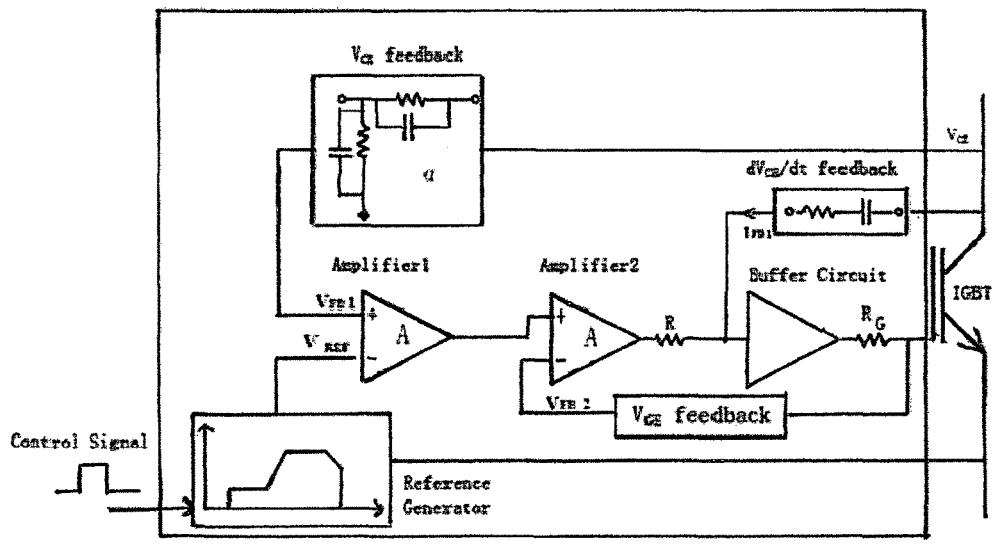

FIG. 13b shows an example current-voltage profile of the diverter M3 for voltage balancing at, e.g., the start of static off.

Any of the embodiments described herein may be applied to, e.g., HVDC (high voltage DC), LLC (generally thyristor based, e.g., with multiple inductors) or VSC (Voltage Source Control, generally uses IGBTs) applications. Embodiments may be used for example in DC-DC converters. A suitable type of HVDC converter for an embodiment is a MMC (modular multilevel converter). Any such applications may use voltage shaping, or all switching devices (e.g., IGBTs) may be switched simultaneously. Embodiments are of particular use for HVDC links such as been countries, and/or where DC transmission provides lower losses, e.g., where there is large capacitance for example as is generally the case for long undersea cables such as for offshore wind. Other applications may include railway traction and other grid-connected applications, and medium voltage applications such as for motor drives.

It is further noted that in an embodiment any one or more diverter(s) provided for voltage balancing and/or clamping during any part of a power switching device switching cycle (e.g., to have increasing impedance at the start of static off to help mitigate tail and/or leakage current effects) may be further controlled for voltage balancing and/or clamping during any other part of that or another cycle (e.g., to function as a voltage clamp to the power switching device for example during turn-off, and/or to pass a "known" current to a respective power switching device during turn-on, and/or to improve synchronisation of slow turn-on). Thus, any one or more diverter uses as disclosed herein are combinable to be applied to the same or different diverters in an embodiment.

No doubt many other effective alternatives will occur to the skilled person. It will be under stood that the invention is not limited to the described embodiments and encompasses modifications apparent to those skilled in the art lying within the spirit and scope of the claims appended hereto.

The invention claimed is:

1. A method of voltage balancing series-connected power-switching devices, wherein at least one power-switching device is connected in parallel with a respective diverter, each diverter having controllable impedance to controllably conduct current diverted from a respective power-switching device, the method comprising the steps of:
    controlling each diverter to follow a series of successively higher impedance states during an off period of the power-switching devices, the series comprising at least two of the impedance states, wherein each the series comprises at least a first impedance of a diverter and then a second, higher impedance of the diverter, the first impedance occurring response to an indication of a start of the off period,
    monitoring a signal of each diverter to thereby detect imbalance between the monitored signals, wherein each the signal indicates at least one of current through and voltage across the diverter,
    wherein at least one of the successively higher impedance states of at least one diverter is responsive to detecting a reduction of a the imbalance.

2. The method defined in claim 1, wherein
    the first impedance occurs during a tail current of the power-switching device in parallel with the diverter and a later impedance state of the series occurs during a leakage current of the power-switching device,
    the later impedance state occurs responsive to detecting an end of the tail current.

3. The method defined in claim 1, wherein
    at least one of the successively higher impedance states of a diverter occurs when a maximum detected difference between the monitored signals of the diverter and at least one other diverter is less than a predefined amount.

4. The method of claim 1, wherein
    at least one of the successively higher impedance states of at least one diverter occurs at a predefined time delay from the indication of the start of the off period.

5. The method of claim 1, further comprising the step of:
    turning at least one of the diverters off at a predefined time from the indication of the start of the off period.

6. The method of claim 1, further comprising the step of:
    controlling the diverter impedances synchronously.

7. A method of dynamic voltage balancing of series-connected power-switching devices, each the power-switching device coupled in parallel with a respective diverter having controllable impedance to controllably conduct current diverted from the power-switching device, the method comprising the steps of:
    a) controlling each diverter to have a first impedance, wherein the power-switching devices are off; then
    b) controlling each diverter to have a second, higher impedance to cause current to be commutated from the diverter to the power-switching device coupled in parallel with the diverter; and then
    c) turning each power-switching device fully on;
    d) each diverter when having the first impedance is controlled to have a predefined current for commutation in step b) to the power-switching device connected in parallel with the diverter;
    e) feedback loops are used to control respective power-switching devices, each the feedback loop comprising a difference amplifier receiving from the diverter coupled in parallel with the power-switching device a feedback signal indicating at least one of current through and voltage across the diverter, wherein the difference amplifier controls the respective power-switching device based on a difference between a reference signal and the feedback signal, step b) comprises for each the feedback loop:
        setting the reference signal to the difference amplifier to differ from the feedback signal;
        the difference amplifier beginning to turn the power-switching device on responsive to the difference between the reference signal and the feedback signal;
        detecting a degree of stabilization of the feedback loop; and then
        increasing impedance of the diverter responsive to the change detection,
    step c) comprises adjusting the reference signal to cause the feedback loop to fully turn on the power-switching device; and
    f) the detecting a degree of stabilization of the feedback loop comprises detecting a predefined change of the feedback signal.

* * * * *